(12) United States Patent
Chen et al.

(10) Patent No.: US 6,221,751 B1
(45) Date of Patent: Apr. 24, 2001

(54) WAFER FABRICATION OF DIE-BOTTOM CONTACTS FOR ELECTRONIC DEVICES

(75) Inventors: Changsheng Chen, Santa Clara; Phil P. Marcoux, Mountain View; Wendell B. Sander, Los Gatos; James L. Young, Mountain View, all of CA (US)

(73) Assignee: ChipScale, Inc., San Jose, CA (US)

( * ) Notice: Subject to any disclaimer, the term of this patent is extended or adjusted under 35 U.S.C. 154(b) by 0 days.

(21) Appl. No.: 09/105,504

(22) Filed: Jun. 26, 1998

Related U.S. Application Data

(62) Division of application No. 08/788,762, filed on Jan. 24, 1997, now Pat. No. 5,910,687.

(51) Int. Cl.[7] .................................................. H01L 21/44
(52) U.S. Cl. ..................... 438/612; 438/110; 438/112; 438/113; 438/458; 438/459; 438/460; 438/462; 438/613; 438/617
(58) Field of Search .................................. 438/612, 613, 438/614, 617, 618, 624, 110, 112, 113, 458, 459, 460, 462, 464; 257/784, 773, 787, 780, 501, 506

(56) References Cited

U.S. PATENT DOCUMENTS

| 4,870,475 | 9/1989 | Endo et al. ............................. 357/71 |
| 4,931,410 | 6/1990 | Tokunaga et al. .................... 437/189 |
| 5,071,792 | 12/1991 | Van Vonno et al. ................. 437/227 |

(List continued on next page.)

FOREIGN PATENT DOCUMENTS

| 7-169796 | 7/1995 | (JP) . |
| WO 95/34083 | 12/1995 | (WO) . |

OTHER PUBLICATIONS

"Joint Industry Standard Implementation of Flip Chip and Chip Scale Technology", The Institute for Interconnecting and Packaging Electronic. Circuits, Jan. 1996.

Patent Abstract of Japan (EPO).

PCT International Search Report.

*Primary Examiner*—Carl Whitehead, Jr.
*Assistant Examiner*—Toniae M. Thomas
(74) *Attorney, Agent, or Firm*—Blakely, Sokoloff, Taylor & Zafman LLP

(57) ABSTRACT

A packaging technique for electronic devices includes wafer fabrication of contacts on the bottom surface of the substrate underneath the active circuit. Inherently reliable contacts suitable for a variety of devices can be formed, via a simple fabrication process, with good wafer packing density. In one embodiment, a trench is formed in the top surface of a substrate parallel to the edge of its electronic circuit. A gold wire extends from a connection point within the circuit into the trench. The gold wire may run over an insulating layer that ends part way through the trench. After epoxy encapsulating the top of the substrate, it is back thinned to expose the bottom surface of the gold wire. Either the back thinning is selective so as to form a substrate standoff, or an epoxy standoff is applied to the bottom of the substrate. A solderable wire runs onto the standoff from the gold wire exposed on the protrusion, possibly over another insulation layer. If an insulative substrate is used, the insulation layers may be optional. Sawing separates the electronic devices and completes their fabrication, without a subsequent assembly step. In another embodiment, the trench in which the gold wires and the solderable wires connect is formed from the bottom of the substrate after it has been epoxy encapsulated. Optionally, the bottom surface of the substrate of the finished device drops down to be co-planar with the contact bottom surfaces, so as to conduct heat out of the device.

44 Claims, 30 Drawing Sheets

U.S. PATENT DOCUMENTS

| | | | |
|---|---|---|---|
| 5,280,194 | 1/1994 | Richards et al. | 257/724 |
| 5,306,942 | 4/1994 | Fuji | 257/508 |
| 5,353,498 | 10/1994 | Fillion et al. | 29/840 |
| 5,403,729 | 4/1995 | Richards et al. | 437/51 |
| 5,407,864 | 4/1995 | Kim | 437/203 |
| 5,434,745 | 7/1995 | Shokrgozar et al. | 361/735 |
| 5,441,898 | 8/1995 | Richards et al. | 437/15 |
| 5,444,009 | 8/1995 | Richards et al. | 437/51 |
| 5,455,187 | 10/1995 | Richards et al. | 437/62 |
| 5,521,420 | 5/1996 | Richards et al. | 257/735 |
| 5,557,149 | 9/1996 | Richards et al. | 257/724 |
| 5,559,362 | 9/1996 | Narita | 257/620 |
| 5,565,697 | 10/1996 | Asakawa et al. | 257/347 |
| 5,592,022 | 1/1997 | Richards et al. | 257/735 |
| 5,595,935 | 1/1997 | Chan et al. | 437/187 |
| 5,606,198 | 2/1997 | Ono et al. | 257/666 |
| 5,639,694 | 6/1997 | Diffenderfer et al. | 437/209 |
| 5,656,547 | 8/1997 | Richards et al. | 438/460 |

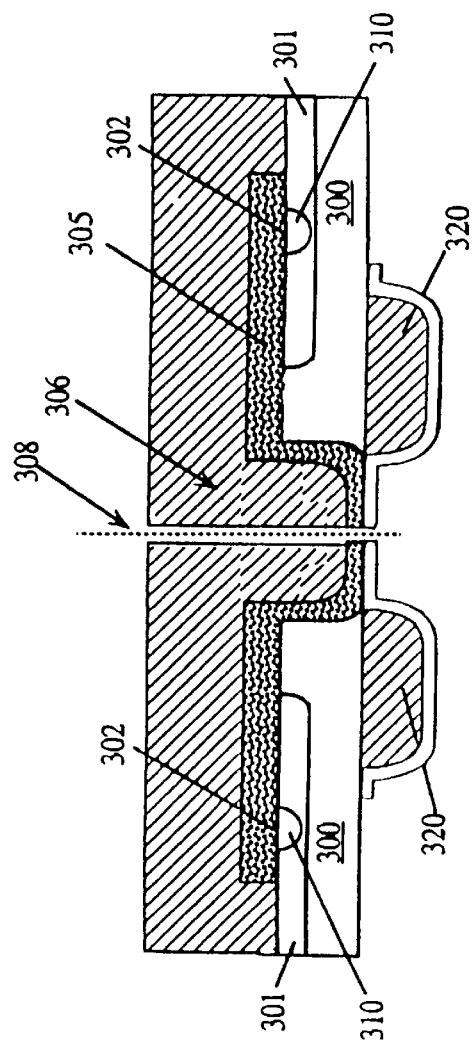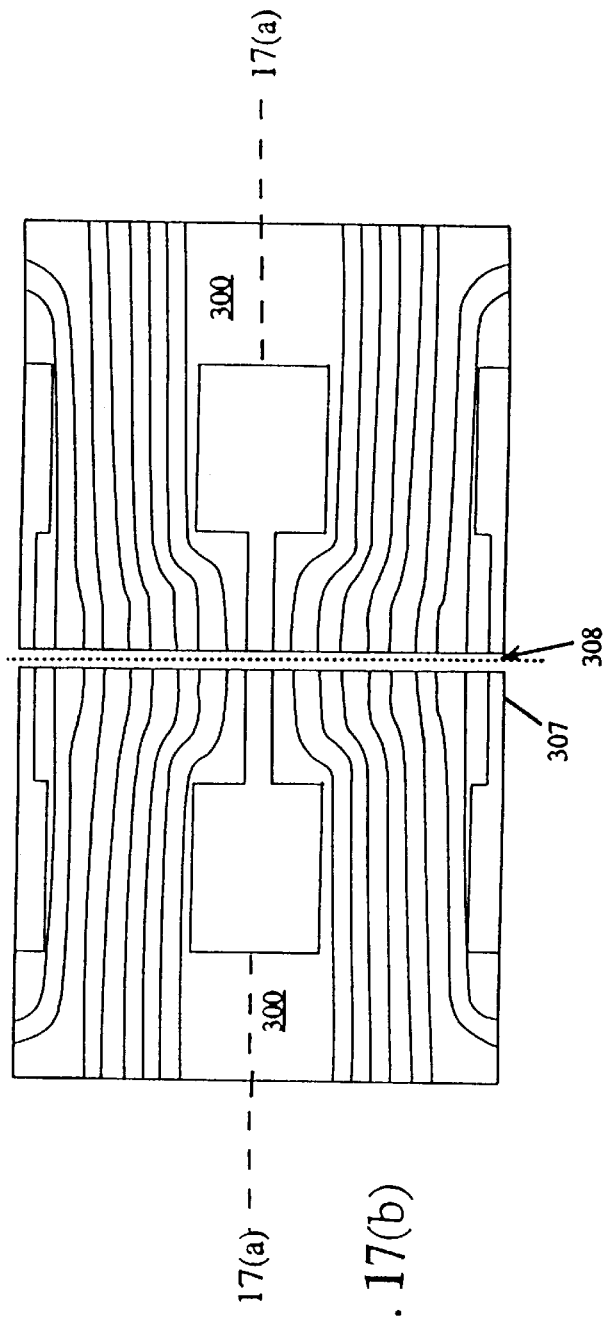
Fig. 17(a)
Fig. 17(b)

WAFER FABRICATION OF DIE-BOTTOM CONTACTS FOR ELECTRONIC DEVICES

This application is a divisional of U.S. Pat. application No. 08/788,762 filed Jan. 24, 1997, which issued on Jun. 8, 1999 as U.S. Pat. No. 5,910,687.

FIELD OF THE INVENTION

The present invention relates generally to the field of electronic device packaging and fabrication. More particularly, the present invention relates to improved contacts for semiconductors, integrated circuits and other electronic circuits and discrete electronic components.

BACKGROUND OF THE INVENTION

The package of any electronic device must include contacts for transmitting signals providing power and ground connections between the internal circuitry of the device and external circuitry. Simple examples of prior-art contacts include the wire leads protruding from the ends of a discrete diode or resistor, or the metal caps located on the ends of a fuse. On the other hand, a sophisticated electronic device, such as a microprocessor, may require several hundred contacts. Those devices are usually produced in a package having multiple pins for mounting to a printed circuit board via contact holes.

More modern surface mount techniques can be used to connect a device to a printed circuit board without cumbersome pins. The leads of a surface mount device simply flush mount to the surface of a printed circuit board, such as the motherboard of a personal computer system, onto which the device is attached by soldering to contact wires or conductors. Surface mount leads do not penetrate through the circuit board like a conventional packages having pins, making them efficient to use in production.

Referring now to FIG. 1, a prior-art integrated circuit that is surface mounted to a circuit board is illustrated. This integrated circuit includes a silicon (Si) based integrated circuit 101. Insulating film 102 coats the underside of circuit 101 to protect and passivate it. Epoxy layer 103 and a silicon cap 104 cover circuit 101. Epoxy layer 103 and silicon cap 104 also cover metal bridge 105.

Metal bridge 105 electrically connects circuit 101 to silicon post 106. Epoxy section 111 mechanically secures circuit 101, metal bridge 105 and silicon post 106. Nickel (Ni) plate 107 covers silicon post 106 and forms a butt-joint with metal bridge 105. Nickel plate 107 is electrically coupled to silicon post 106 and metal bridge 105. Nickel plate 107 provides the integrated circuit with a connection point to external circuitry.

This prior-art contact comprises:
1) metal bridge 105,
2) silicon post 106,
3) nickel plate 107, and
4) epoxy section 111.

As illustrated in FIG. 1, the contact of the integrated circuit has been soldered to circuit board conductor 109 with solder fillet 108. Circuit board conductor 109 has been formed onto circuit board substrate 110.

The contact for the integrated circuit illustrated in FIG. 1 provides for various advantages. For example, nickel plate 107 covers the sidewalls of silicon post 106, which helps to strengthen the bond between the circuit 101 and the circuit board substrate 110. This is due to the fact that solder can be placed on nickel plate 107 on the sidewalls of silicon post 106 as illustrated in FIG. 1. It also facilitates inspection during surface mount of the integrated circuit to the circuit board. Whether a good mount is made can be easily confirmed by looking at the solder on the sidewalls of silicon post 106.

Furthermore, nickel plate 107 extends over the sidewalls of silicon post 106 and contacts the side of metal bridge 105, forming a butt-joint interface between nickel plate 107 and metal bridge 105. This provides for an electrical contact between circuit board conductor 109 and circuit 101.

The butt-joint interface of the integrated circuit contact of FIG. 1, however, cannot be formed with much certainty or control over its resulting reliability or bonding adhesion between nickel plate 107 and metal bridge 105. There are a number of reasons for this. The physical surface of the side of metal bridge 105 might not be flat enough to ensure a reliable bond at this butt-joint interface. Furthermore, the side of metal bridge 105 is difficult to clean because of its location on the side of the wafer. The bond at this butt-joint interface therefore might be weakened If the side of metal bridge 105 is not flat or has not been thoroughly cleaned.

The formation of this butt-joint interface also limits the materials that can be used for nickel plate 107 and metal bridge 105. This is so because metal bridge 105 and nickel plate 107 can comprise more than one metal layer. The bonding layer of nickel plate 107 then has to be formed so as to bond with each metal layer at the side of metal bridge 105 in order to form an effective contact. Accordingly, the selection of materials that can be used for metal bridge 105 and for the bonding layer of nickel plate 107 is limited.

FIG. 2 shows a prior-art contact that avoids a butt-joint by using a wrap-around flange contact. Silicon based circuit 101, insulating film 102, epoxy layer 103, silicon cap 104, metal bridge 105, silicon post 106, solder filet 108, circuit board conductor 109, circuit board substrate 110, and epoxy section 111 are similar to that of the above described butt-joint contact. However, wrap around nickel plate 112 and metal bridge 105 have a horizontal flange interface 113. While the wrap around flange avoids the problems associated with a butt-joint, it is still a relatively complex design, requiring a rather involved series of processing steps and a relatively large amount of wafer area dedicated to contact fabrication.

SUMMARY AND OBJECTS OF THE INVENTION

An object of the present invention is to simplify the process of fabricating contacts for electronic devices.

Another object is to increase the simplicity and the reliability of contacts for electronic devices.

A further object is to increase the wafer packing density of an electronic circuit by reducing the substrate area that is used for fabricating the device's contacts.

Another object is to provide contacts that have physical and electronic properties applicable to varied types of electronic devices.

Accordingly, a contact for an electronic device is described that comprises a standoff on the bottom surface of the substrate and a lower wire that extends from the standoff to an upper wire that runs on an encapsulant protrusion.

Such a contact is fabricated by forming a trench in the top surface of a substrate. The trench may be located near the edge of an electronic circuit or discrete component formed using or attached to the substrate. Optionally, an insulation layer is formed that has a through hole at a connection point within the circuit or component, and that ends part way through the trench. An upper wire is formed that runs from the connection point into the trench. The top of the substrate is encapsulated, forming an encapsulant protrusion in the trench.

In one embodiment, the substrate is selectively thinned from the bottom, exposing part of the bottom surface of the upper wire. In the next step, a standoff is formed below the bottom surface of the substrate. Alternatively, the standoff can be formed from the substrate during the selective thinning step. A lower wire is formed that runs on the bottom of the substrate from the exposed portion of the upper wire and onto the standoff.

In another embodiment, there is no top-surface trench. Rather, the trench in which the upper wires and the lower wires connect is formed from the bottom of the substrate after it has been encapsulated.

Optionally, the thinning of the substrate's bottom surface leaves a portion of the bottom surface of the substrate substantially co-planar with the bottom of the contacts.

Other objects, features, and advantages of the present invention will be apparent from the accompanying drawings and from the detailed description below.

BRIEF DESCRIPTION OF THE DRAWINGS

The present invention is Illustrated by way of example and not limitation in the Figures of the accompanying drawings in which like references indicate similar elements, and in which:

FIGS. 17(a) and 17(b) illustrate a cross-sectional side view of two electronic devices and contacts comparable to those of FIGS. 13(a) and 13(b), but made using a gallium arsenide substrate wafer for which no insulator is necessary.

DETAILED DESCRIPTION

The present invention encompasses embodiments involving various types of contacts for electrical or electronic devices that include a contact layer or wire that runs on the bottom surface of an insulative standoff located on the bottom surface of the devices' substrate underneath the passive or active circuit or component of an electronic device (i.e. the die). The present invention also encompasses embodiments in which there is no insulative standoff, wherein the contact layer runs over a substrate standoff. One embodiment employs a trench within the top surface of the substrate to connect the contact layer to an upper wire or beam that runs to the circuit or component on the die and where another embodiment uses a bottom-surface trench. Yet another embodiment incorporates insulative substrates and another uses conductive substrates with insulation layers. Still another embodiment uses a drop bottom, in which the substrate extends down to the circuit board to which the device is attached, so as to transfer heat thereto.

Die-Bottom Contacts with a Formed Standoff

Figure 12:
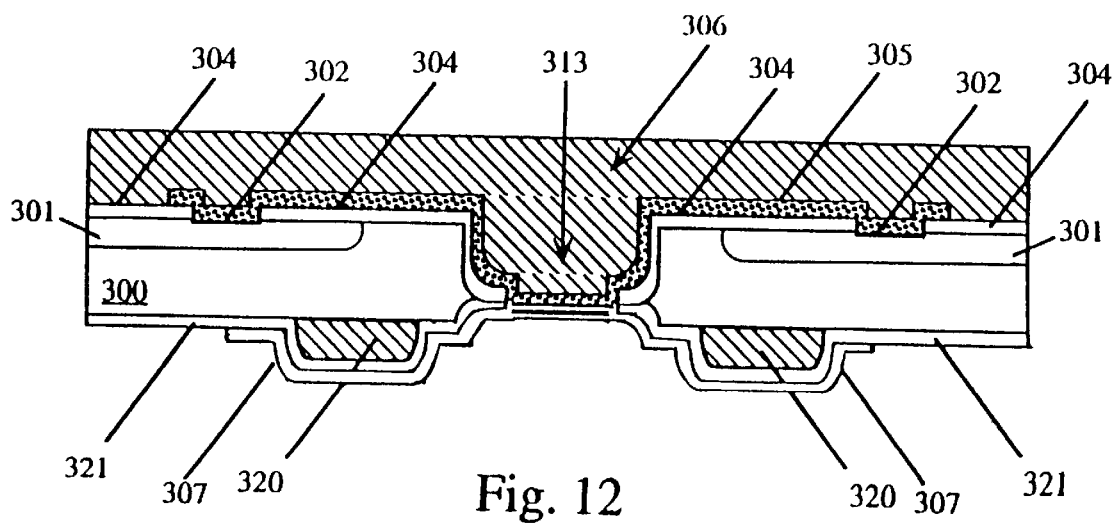
FIG. 12 shows a cross-sectional side view of the wafer portion of the previous Figure after a contact wire has been formed on its bottom surface.
Figure 13A:
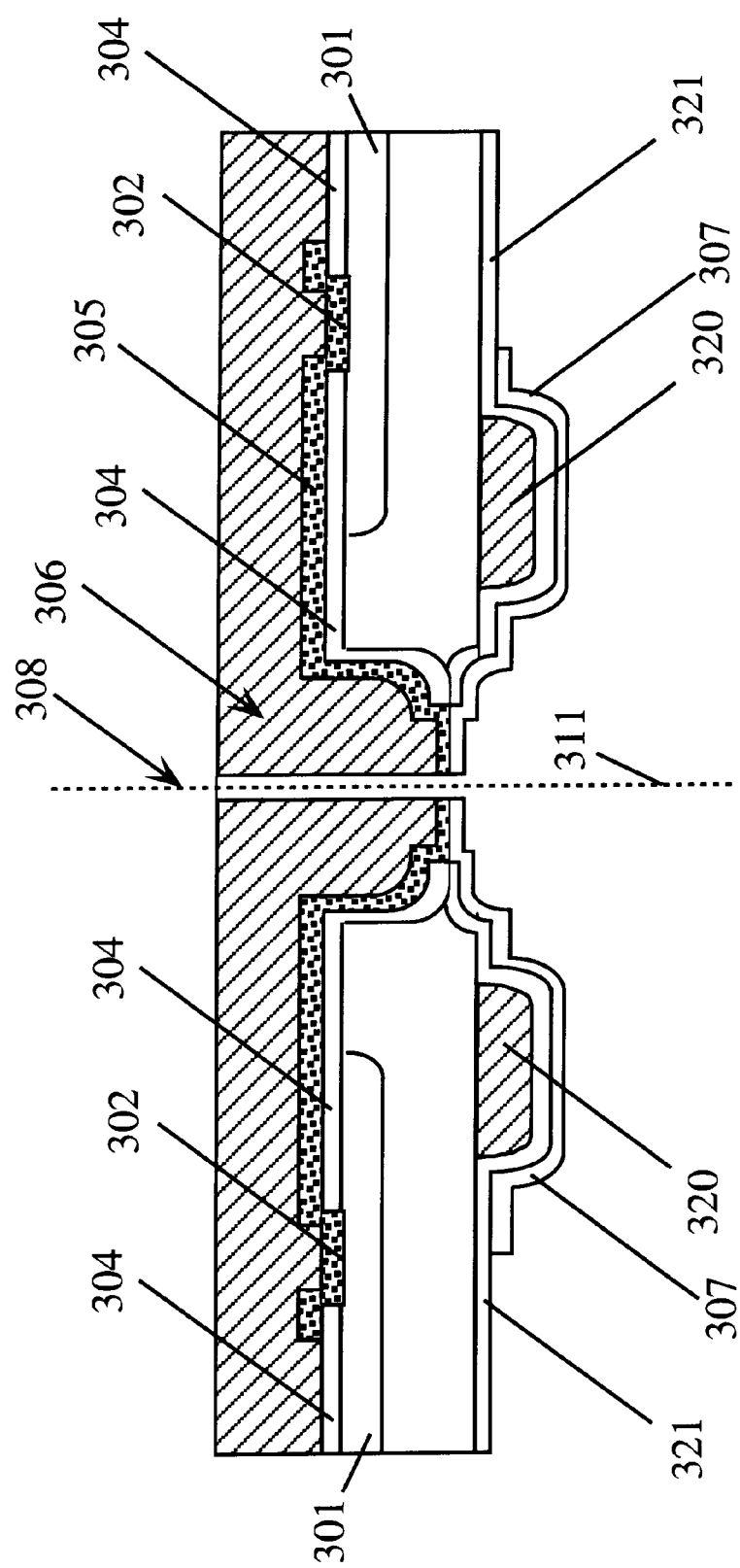
FIGS. 13(a) and 13(b) show a cross-sectional side view of the wafer portion of the previous Figure after it has been sawed into electronic devices, each with an attached contact and a corresponding partial bottom view of the same two electronic devices, each with multiple contacts in a two dimensional array.
Figure 13B:
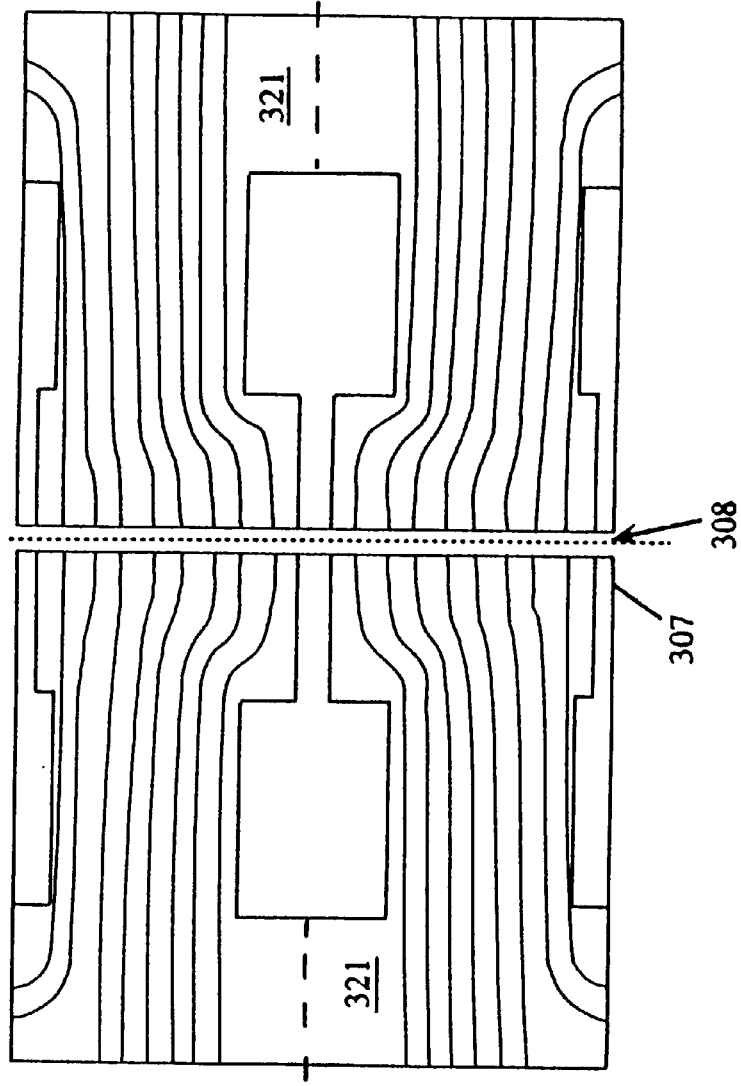
Figure 14:
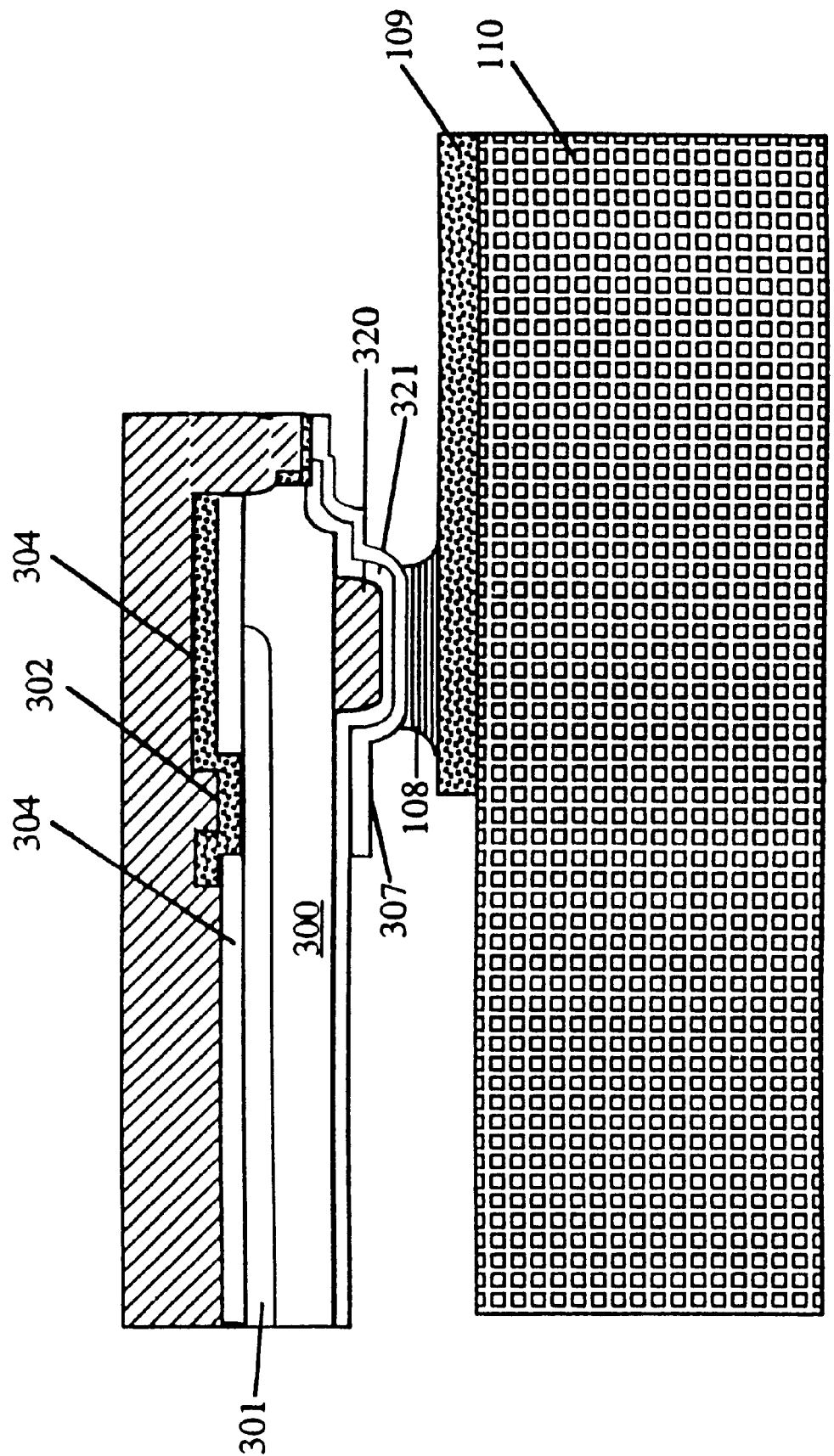
FIG. 14 shows a cross-sectional side view of the electronic device and contact of the previous Figure after it has been soldered onto a circuit board.
Figure 15:
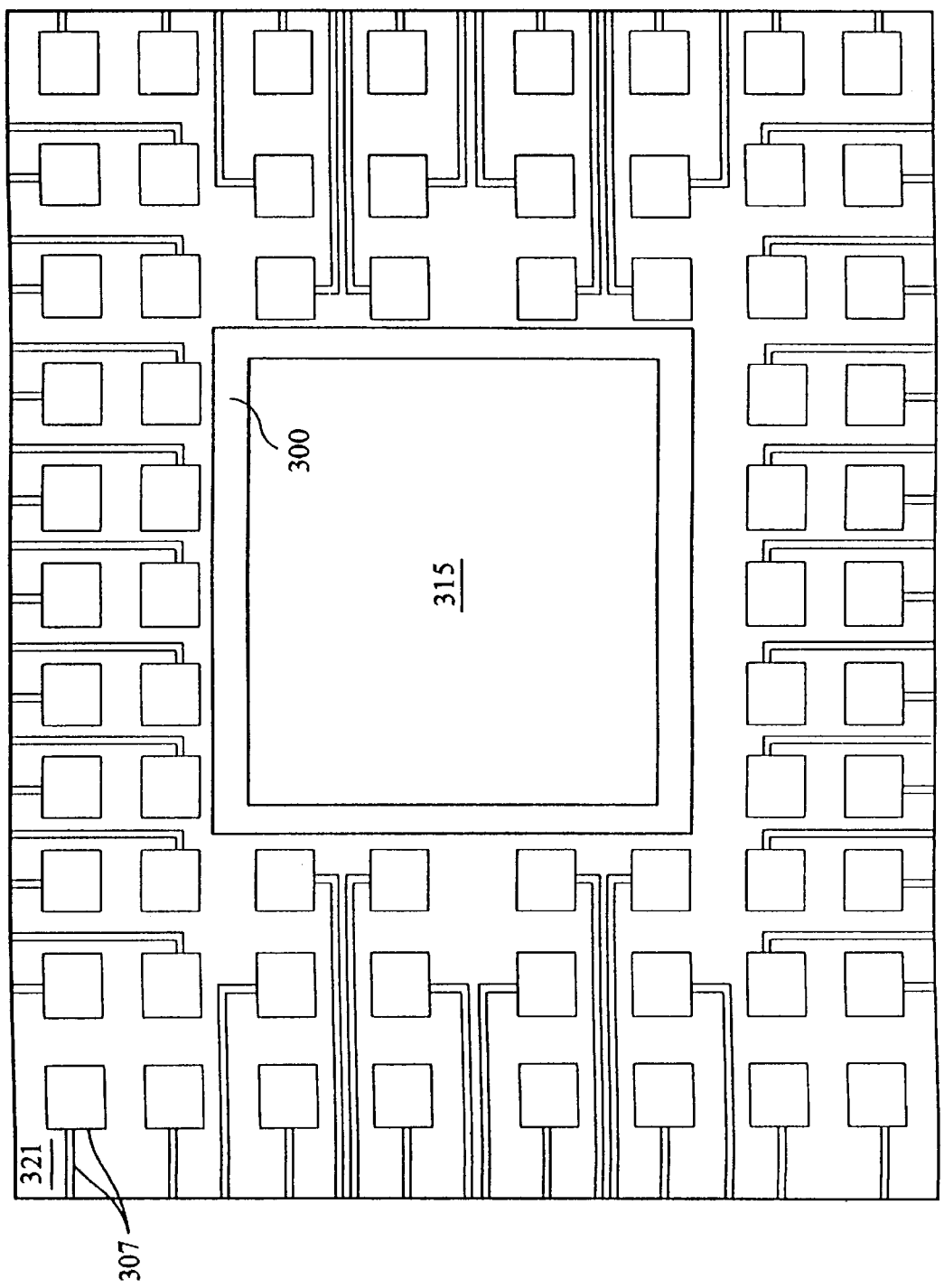
FIG. 15 shows a complete bottom view of one of the electronic devices of the previous Figure, with multiple contacts in a two dimensional array and with a bottom substrate surface that drops down to circuit-board level to dissipate heat generated in the electronic device by transferring the heat to the circuit board.
Figure 16:
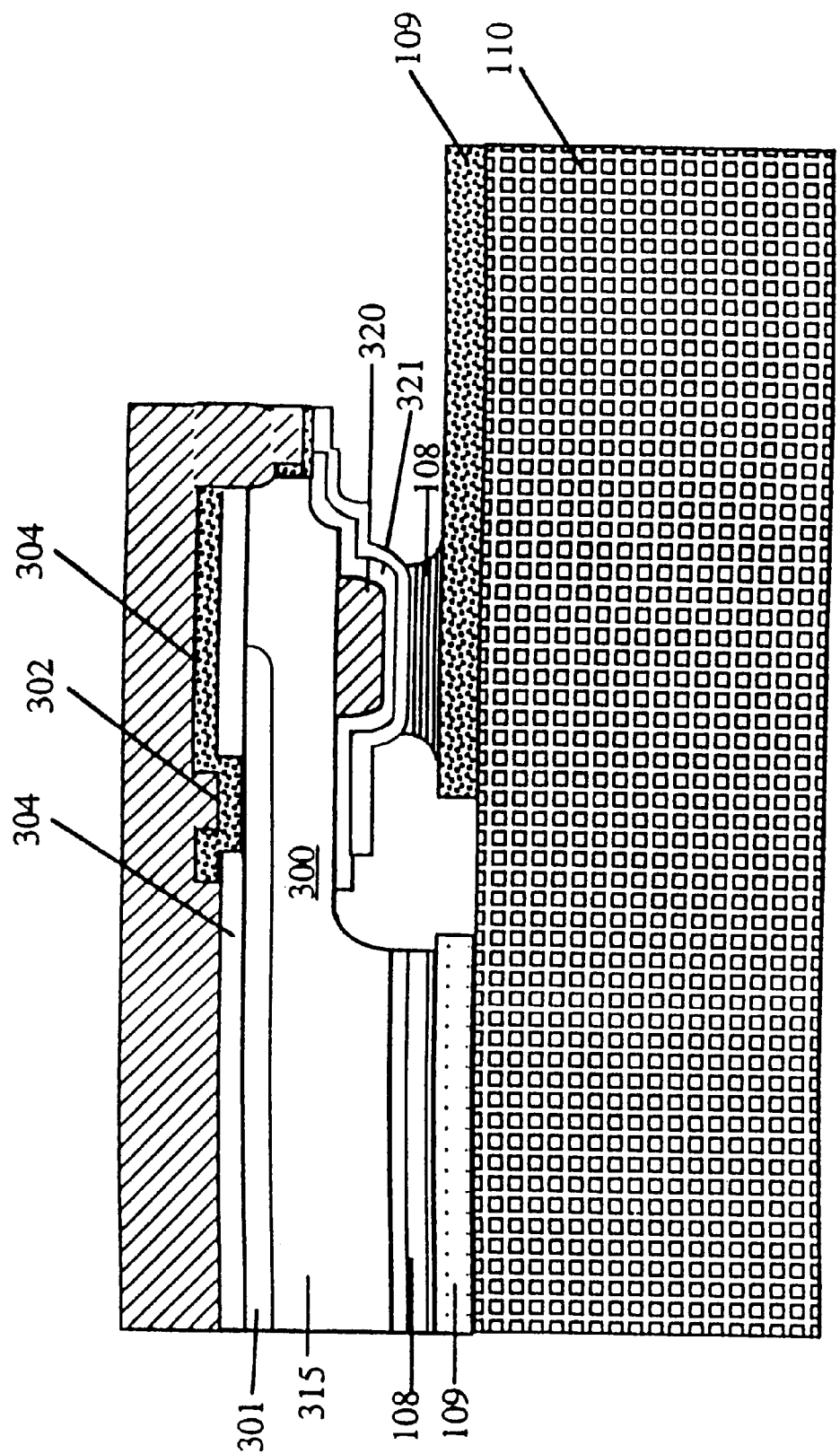
FIG. 16 shows a cross-sectional side view of the electronic device, contact and drop bottom of the previous Figure after being soldered onto a circuit board.

Die-bottom contacts comprising a standoff that is applied to the bottom surface of the substrate, a wire running on the standoff and an insulation layer between the wire and the substrate are illustrated in FIG. 13, FIG. 15 and FIG. 17. How such a contact is attached to a circuit board is illustrated in FIG. 14 and FIG. 16. How such a contact is fabricated is illustrated in FIG. 3 through FIG. 13. During fabrication, a wafer is typically held by a carrier.

A brief description of how such a contact can be fabricated is as follows:

1) A trench is formed in the top surface of a substrate, such as, but not limited to, a semiconductor wafer. The trench may be located near the edge of an electronic circuit or component, such as, but not limited to, an integrated circuit. The circuit or component is formed using the substrate, or is attached to the substrate.

2) An upper insulation layer is formed having a through-hole over a connection point within the circuit. The insulation layer ends part way through the trench.

3) An upper interconnection wire or beam is formed that runs from the connection point into the trench.

4) The top of the substrate is encapsulated, forming an encapsulant protrusion in the trench. Optionally, the encapsulant can include a cap layer.

5) The substrate is thinned from the bottom, thus forming the bottom surface of the finished electronic device. The substrate is further selectively thinned from the bottom to expose part of the bottom surface of the upper wire on the encapsulant protrusion.

6) A standoff is applied to or formed on the bottom surface of the substrate.

7) A lower insulation layer is formed that has a through hole over the exposed portion of the upper wire.

8) A lower wire or contact layer is formed that runs on the bottom surface of the substrate from the exposed portion of the upper wire and onto the standoff.

9) Optionally, the top surface of the electronic devices can be marked, so as to identify the part type and the orientation of pin number 1.

10) The wafer is diced. For some embodiments, this completes the fabrication of the electronic device.

11) Optionally, the electronic devices can be tested while still attached to a carrier.

Figure 3A:
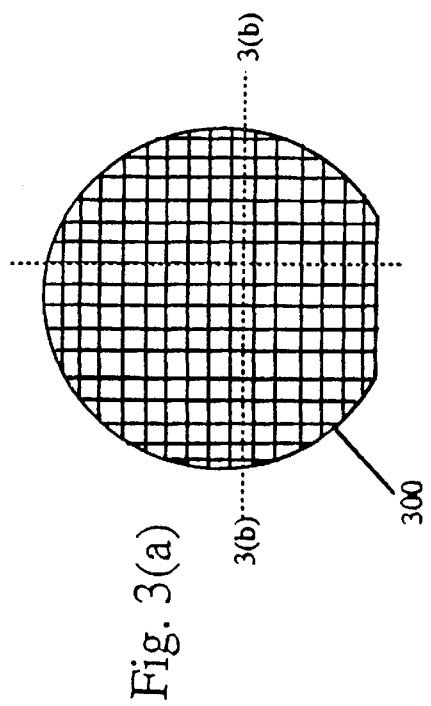
FIGS. 3(a) and 3(b) illustrate a top view of a substrate wafer showing how its top surface is tiled with replications of die, each of which will become an electronic device, and a cross-sectional side view of a portion of the wafer showing the electronic circuit or component areas for two adjacent devices, each having a connection point.
Figure 3B:
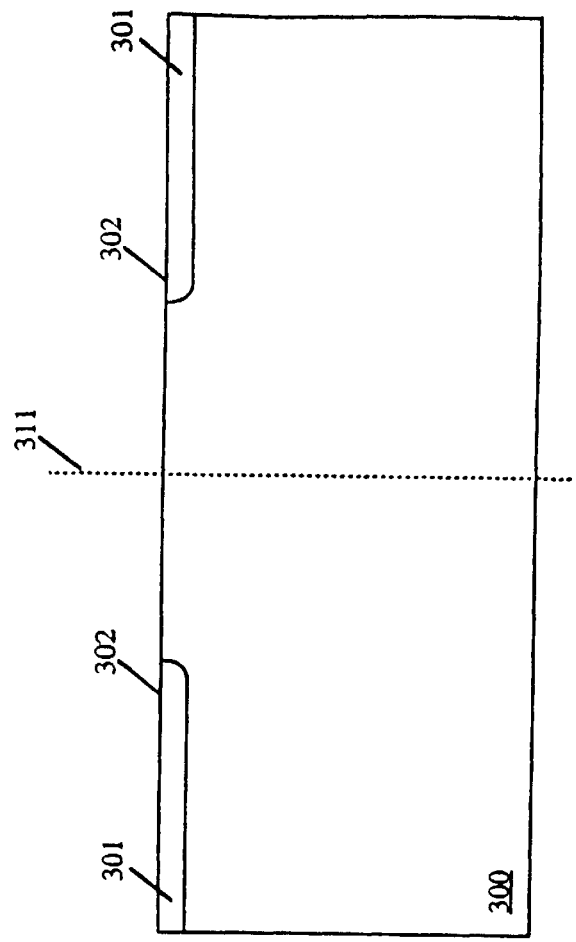

To aid in understanding this fabrication process in more detail, FIG. 3 illustrates a top view of substrate wafer 300, with a corresponding cross section. The top surface of substrate wafer 300 has been used to fabricate a number of integrated circuits each within a rectangular die that is replicated or tiled across the wafer. Cut line or separation plane 311 is one of the planes along which substrate wafer 300 will be separated or diced into individual electronic devices—finished electronic devices, not merely die requiring a subsequent assembly process.

Any material that is suitable for the fabrication of electronic circuitry and is that is suitable for shaping via etching, shaving or the like can be used for substrate wafer 300. In some embodiments, substrate wafer 300 is formed of crystalline silicon (Si). Other embodiments use other semiconductors for substrate wafer 300 such as but not limited to the following: gallium arsenide (GaAs), silicon germanium (SiGe), silicon carbide (SiC), gallium phosphide (GaP) or the like. Yet other embodiments use insulative substrates, such as, but not limited to ceramic materials, sapphire, quartz or the like.

A cross-sectional view of substrate wafer 300 is also shown in FIG. 3, the cross section being taken along line 3(b). The top surface of substrate wafer 300 has been used to fabricate an integrated circuit within electronic circuit regions 301. Electronic circuit regions 301 include connection points 302. An electrical signal or power supply voltage must be connected between connection points 302 and circuitry external to the finished electronic device in order for it to operate property.

Various techniques for fabricating electronic circuits using substrate wafer 300 are known in the art as well as for attaching fabricated electronic circuits to substrate wafer 300. The description below of the contact fabrication process assumes that the fabrication of the electronic circuit or component or its attachment to substrate wafer 300 has been completed.

Still referring to FIG. 3, electronic circuit regions 301 suggest an integrated circuit that is fabricated using the top surface of substrate wafer 300. Nevertheless, the techniques and embodiments described throughout this disclosure apply to contacts for any electronic circuit or discrete electronic component that can be fabricated using, or attached to, substrate wafer 300. For example, a passive discrete component, such as, but not limited to a resistor or capacitor, or an active discrete component such as, but not limited to a transistor, power transistor, diode, thrysister, field-effect transistor (FET) or the like could include connection points 302 and could have contacts fabricated according to any of the techniques or embodiments disclosed herein. As a further example without limitation, various integrated circuits or other electronic circuits could be attached to substrate wafers 300 could include connection points 302 and could then have contacts fabricated according to any of the techniques or embodiments disclosed herein.

Generally, an electronic circuit is formed within or attached to square or rectangular shaped electronic regions 301 that are replicated both horizontally and vertically, covering the top surface of substrate wafer 300. Edges of two adjacent electronic circuit regions 301 are also shown in FIG. 3. Connection points 302 are typically near those edges, but could be located away from the edge if desired.

Figure 1:
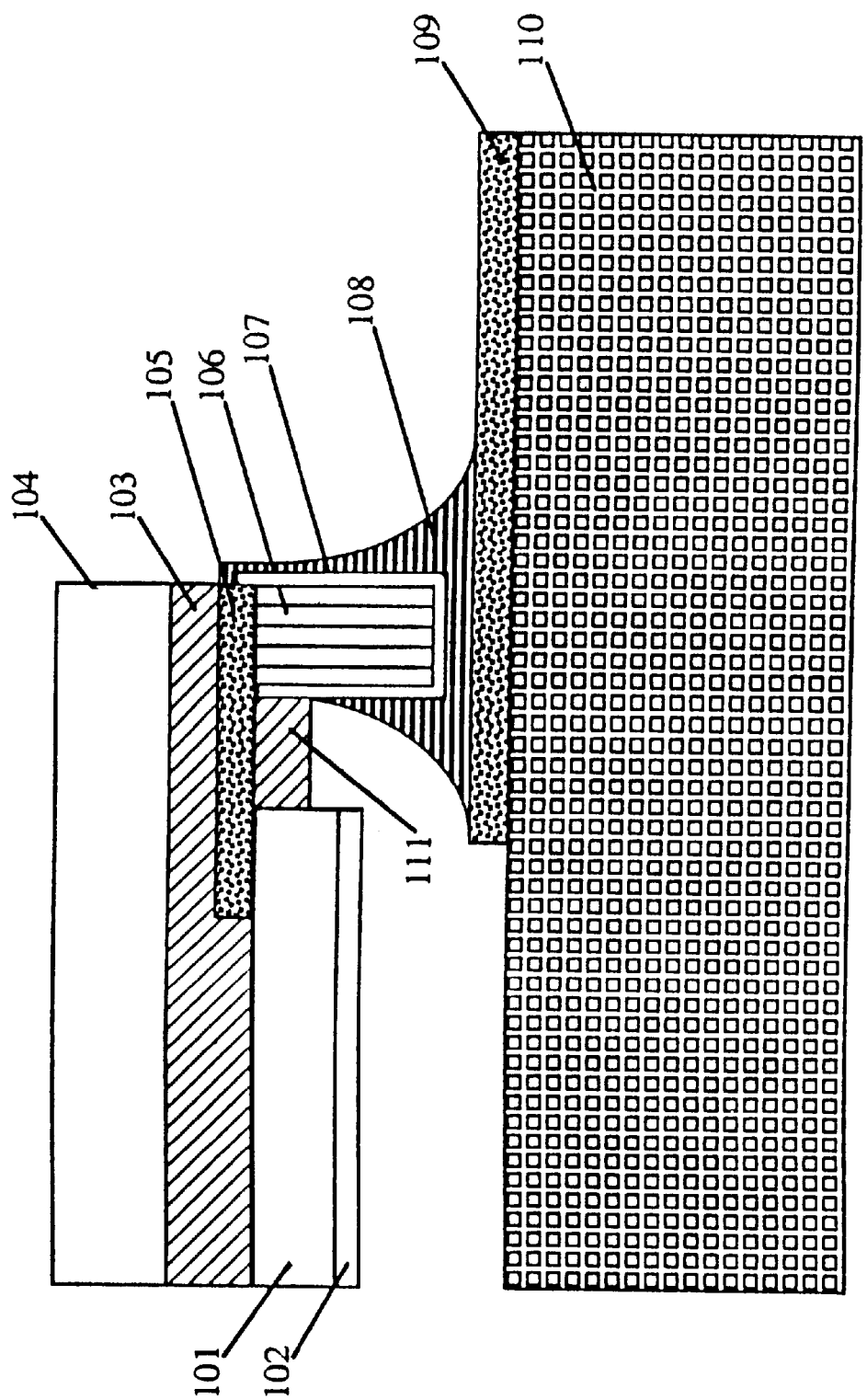
FIG. 1 illustrates a cross-sectional side view of a prior-art integrated circuit butt-joint contact that has been soldered onto a circuit board.
Figure 2:
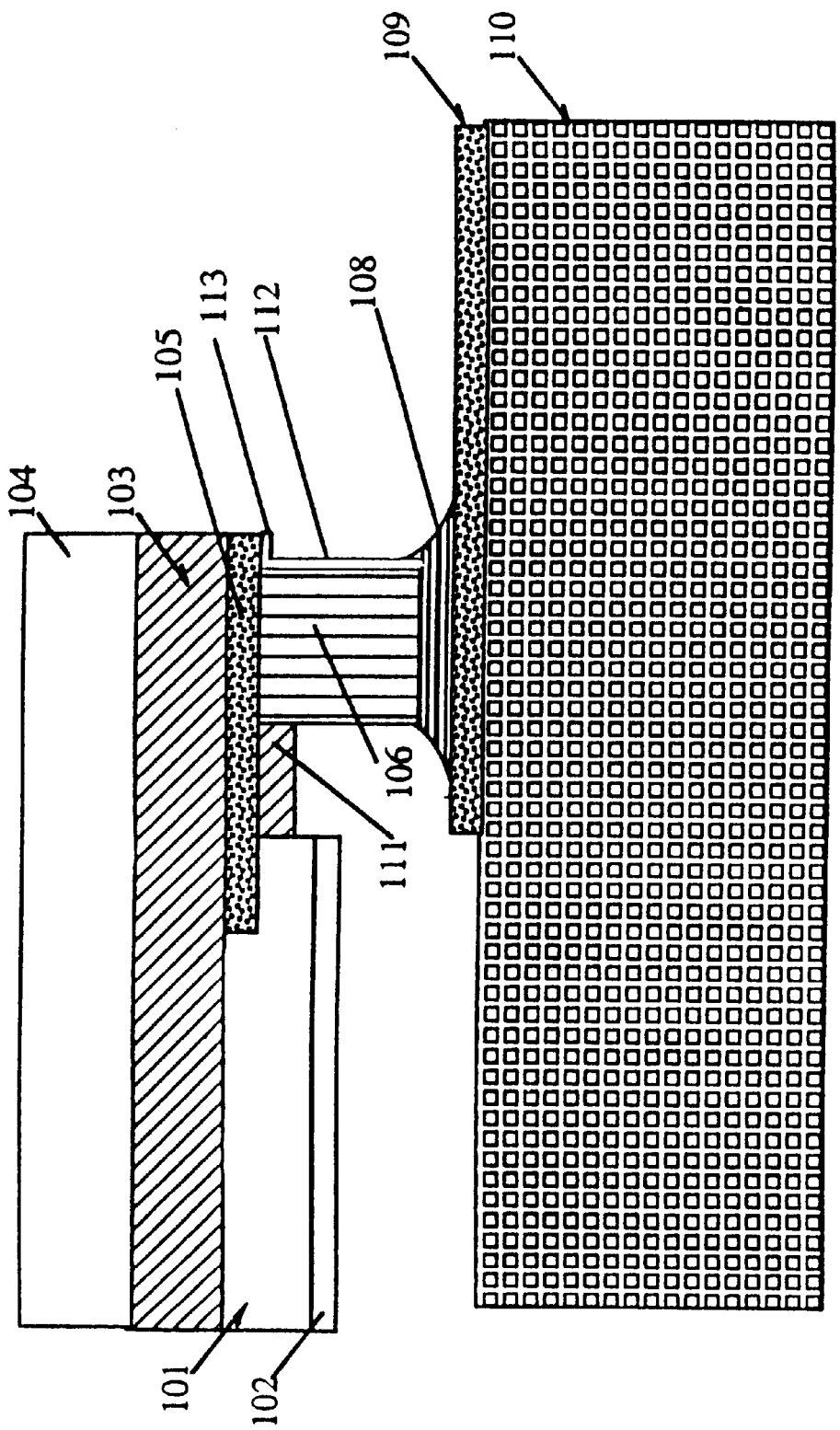
FIG. 2 illustrates a cross-sectional side view of a prior-art integrated circuit wrap-around flange contact that has been soldered onto a circuit board.

A potential advantage of the present method of fabricating contacts is higher wafer packing density. That is, the area of substrate wafer 300 that must be dedicated to forming contacts might be reduced over that required, for example, in the prior-art contact shown in FIG. 2. This may allow more replications of electronic circuit regions 301 to fit on a wafer, thus reducing the manufacturing cost for each device.

Figure 4:
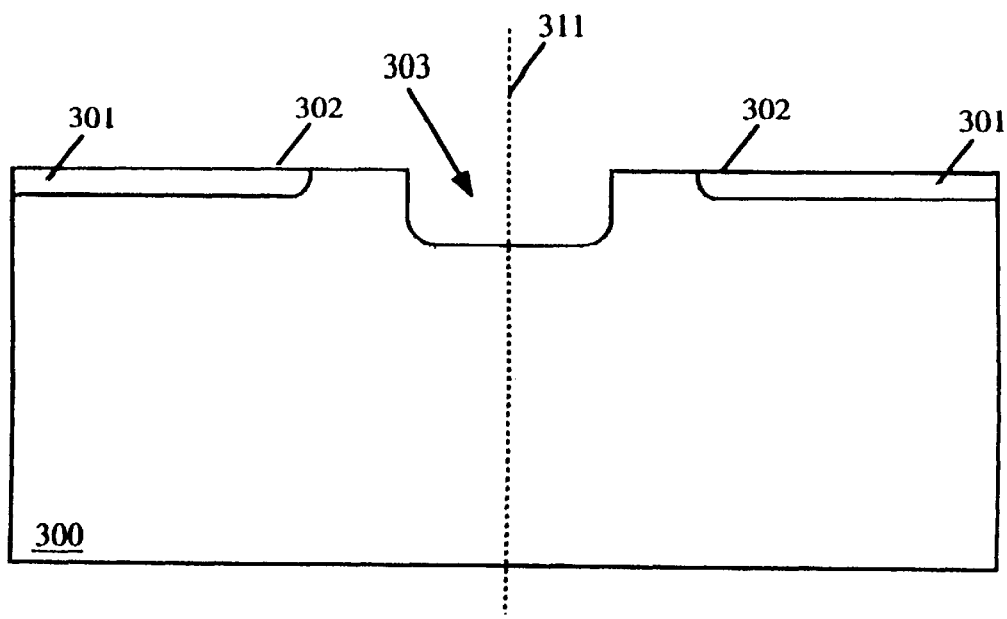
FIG. 4 shows a cross-sectional side view of the wafer portion of the previous Figure after a trench has been etched in the wafer between the two electronic circuit areas.

Referring now to FIG. 4, the first step in fabricating a contact with a substrate post is to form a trench in substrate wafer 300 near, and possibly parallel to, an edge of electronic circuit regions 301. Trench 303 can be formed by any technique, such as but not limited to wet chemical etching, dry plasma etching, mechanical micro machining, sawing, diamond-tip sawing or the like. It might be advantageous to use a technique that allows a relatively deep but narrow trench to be formed, such as but not limited to cutting a starter trench with a diamond-tip saw and then etching, using etching techniques and specialized equipment designed for deep narrow trenches, or the like.

Trench 303 is a relatively deep recess (150 microns deep, for example) into substrate wafer 300. As will become clear, trench 303 must be formed deeper than the thickness of the substrate that will remain beneath electronic circuit region 301 in the finished device.

Numerous methods of forming trench 303 of a suitable size and shape are known. For example, the regions of substrate wafer 300 that are not to be etched can be protected by a photolithographic chemical resist and etch process as follows:

A mask can be prepared on a glass plate. The mask determines which areas of substrate wafer 300 are to be protected. Substrate wafer 300 is coated with a photosensitive resist layer, then ultraviolet light is projected onto the regions that are to be etched (or that are not to be etched). The resulting substrate wafer 300 is subjected to a resist-developer chemical solution that removes only the regions of the resist that were exposed to the ultraviolet light (or that were not exposed to the ultraviolet light). A chemical etch solution is applied that etches substrate wafer 300 in those regions not protected by the resist. After etching has occurred to the desired depth and width, the resist is removed by a resist-dissolving solution.

In other embodiments, dry plasma or ion etching processes can be used instead of the above described wet chemical etch process. In alternative embodiments, there can be a photosensitive layer applied and developed on top of a non-photosensitive resist layer, which is then selectively removed prior to the etch process. Any method of forming trench 303 of a suitable size and shape can be employed.

Figure 5:
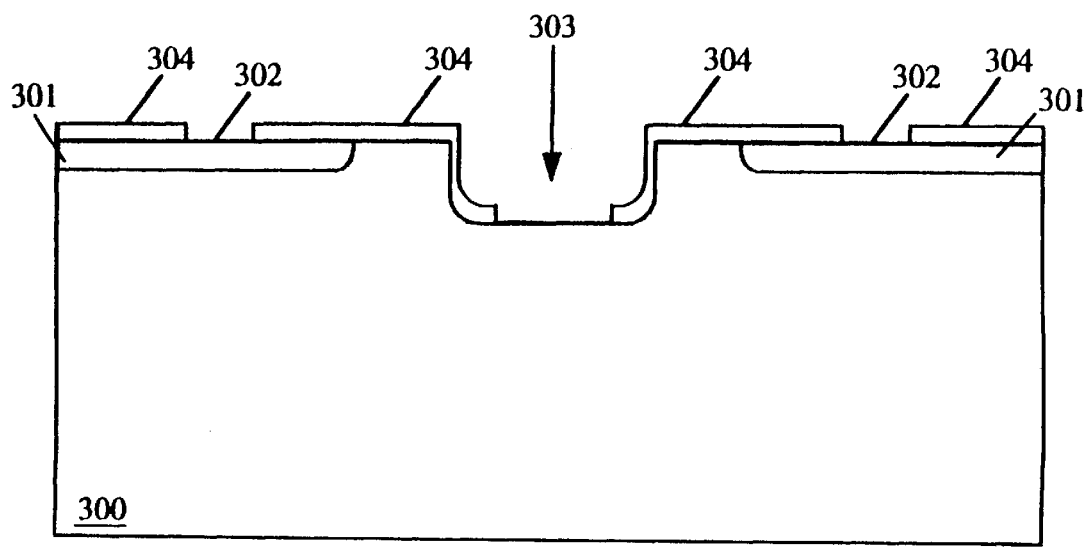
FIG. 5 shows a cross-sectional side view of the wafer portion of the previous Figure after an insulator has been formed on selected portions of the top of the wafer according toga pattern.

Referring now to FIG. 5, the next step in fabricating a contact for embodiments using a conductive substrate wafer 300, is to form insulation layer 304 (with a thickness of 25 microns or less, for example) on selected regions of substrate wafer 300. Insulation layer 304 is formed in a pattern such that connection points 302 and a portion of trench 303 are not insulated.

The embodiment shown in FIG. 5 has insulation layer 304 directly on top of substrate wafer 300. In other embodiments, insulation layer 304 is separated from substrate wafer 300 by other layers (not shown) that form the electronic circuit. Such layers can include, but are not limited to interconnect layers, insulation layers or the like. In some embodiments, insulation layer 304 serves as the passivation layer over electronic circuit regions 301.

Insulation layer 304 can be formed by any technique that selectively forms regions of an insulation layer on top of a substrate according to a pattern. Any technique for forming a layer of any insulating material on top of substrate wafer 300 can be used, such as but not limited to the following: silicon oxide grown from a silicon substrate wafer by an oxidation process (at least for those regions where the substrate is exposed); or silicon oxide ($SiO_2$) or silicon nitride ($Si_3N_4$), aluminum oxide ($Al_2O_3$), polymide resins, epoxy, acrylics, patternable plastics deposited on top of substrate wafer 300; or the like. Any technique for selectively removing regions of that insulation layer can be used, such as, but not limited to a photolithographic etch processes, photolithography directly on a photosensitive insulator, or the like.

Figure 6:
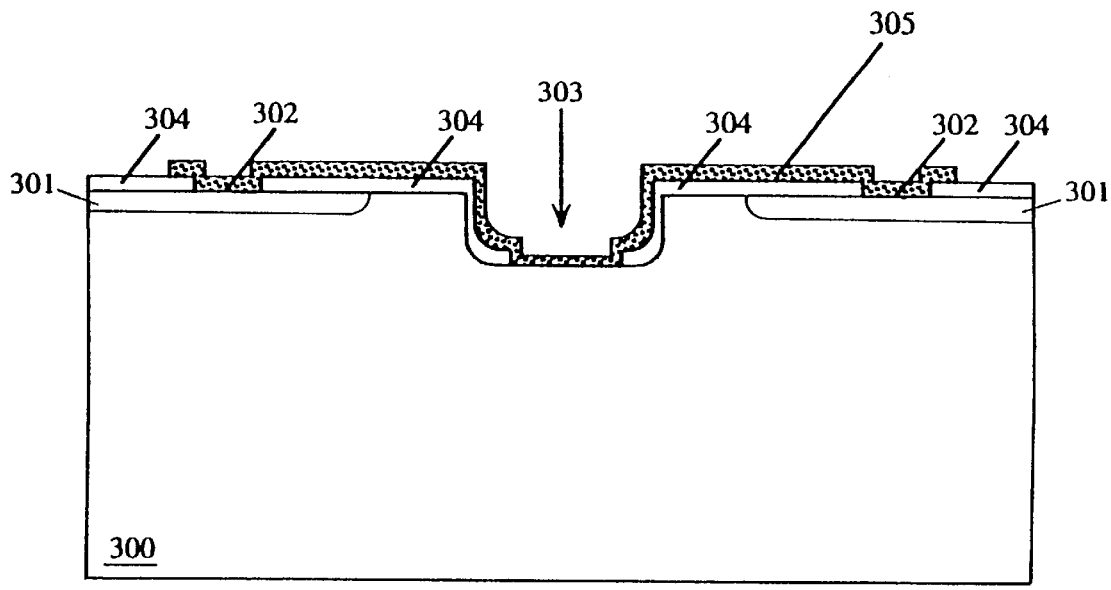
FIG. 6 shows a cross-sectional side view of the wafer portion of the previous Figure after a gold wire has been formed on top of the wafer and the insulator.

Referring now to FIG. 6, the next step in fabricating a contact is to form a beam or an upper interconnection wire 305 (for example, 6 to 10 microns thick and 35 microns wide, or a width going up to whatever is appropriate for the current carried). Interconnection wire 305 extends from connection points 302 within electronic circuit regions 301 into the non-insulated portion of trench 303. Any technique of forming interconnection wire 305 can be used, such as but not limited to pattern plating, sputter deposition of a metal layer within a low-pressure inert gas followed by photolithographically selective etching of that layer, or the like.

Interconnection wire 305 can be any substance of suitable conductivity, for example a metal, such as but not limited to gold (Au), silver (Ag), copper (Cu), aluminum (Al), nickel (Ni), alloys thereof or layers thereof.

Interconnection wire 305 as well as the other metal, wire, interconnect or contact layers described herein might be advantageously formed of layers of metals, such as but not limited to the following: a thin barrier metal layer (as can allow current to flow between certain metals while avoiding the metals directly touching) or a thin seed metal layer (as can facilitate forming a metal layer by plating); followed by a main layer, followed by a gold flash layer (as can resist corrosion).

Figure 7:
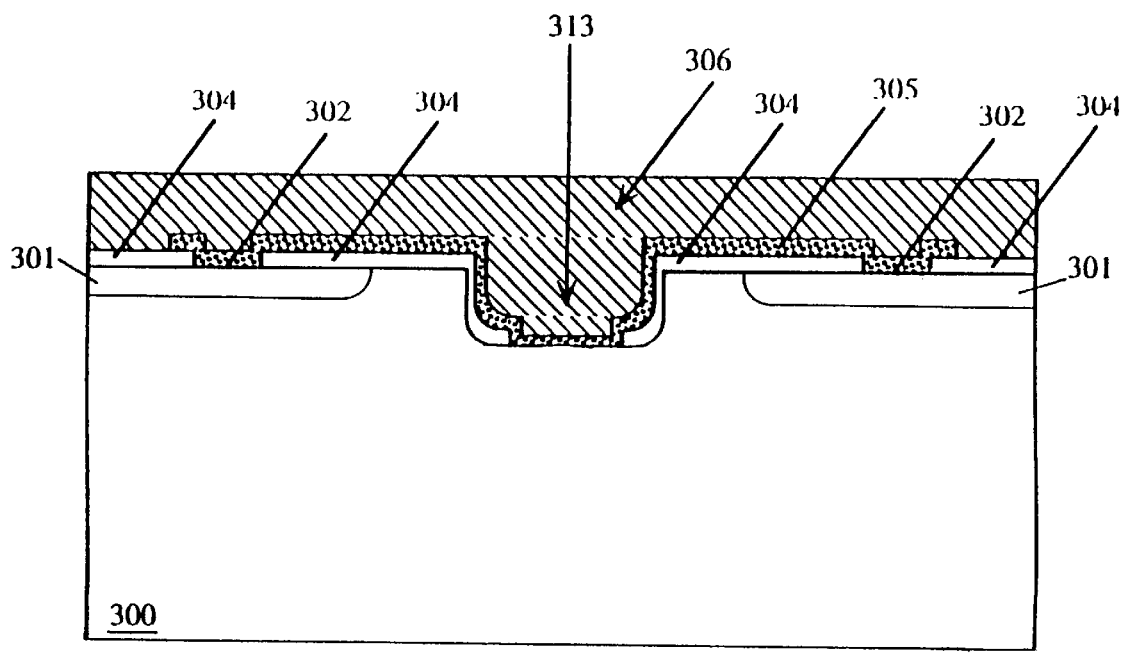
FIG. 7 shows a cross-sectional side view of the wafer portion of the previous Figure after a relatively thick layer of epoxy has been applied to the top surface of the wafer, the insulator, and the gold wire, which encapsulates them into a strong and rigid unit and which forms an encapsulant protrusion.

Referring now to FIG. 7, the next step in forming a contact is to encapsulate substrate wafer 300, insulating layer 304 and interconnection wire 305. The top surfaces of these structures are covered with a relatively thick layer (150 microns, for example) of a strong and insulative encapsulant. The encapsulant fills trench 303, thus forming encapsulant protrusion 313.

Encapsulant layer 306 can be formed of epoxy, glass, plastic, polymide resins, Teflon®, silicon oxide ($SiO_2$), silicon nitride ($Si_3N_4$), mixtures thereof, layers thereof, or any other material that is non-conducting, relatively rigid and strong, and sufficiently flexible or compliant to allow for thermal expansion both in subsequent wafer processing and in the complete electronic system. For example, Hysol® FP4650 epoxy manufactured by Dexter Corp., Electronic Materials Division, of industry, California, might be suitable for encapsulant layer 306. As an alterative to being compliant, encapsulant layer 306 can be formed of a material with thermal expansion characteristics similar to those of substrate wafer 300.

Encapsulant layer 306 can be applied using a variety of techniques. These techniques may attempt to keep encapsulant layer 306 at a uniform thickness, or to eliminate air bubbles within encapsulant layer 306 or between it and substrate wafer 300, insulating layer 304 and interconnection wire 305. In some embodiments, substrate wafer 300 is spun, possibly in a centrifuge, to form encapsulant layer 306. In alternative embodiments, encapsulant layer 306 comprises a high-temperature insulative epoxy material that is cured in a furnace.

In some embodiments, encapsulant layer 306 can include a top or cap layer (not shown) containing materials, such as but not limited to the following: silicon, polysilicon, amorphous silicon, plastic, glass, epoxy, aluminum, diamond, mixtures thereof, layers thereof, or any other material that is relatively rigid and strong. This cap layer can make the finished electronic device more mechanically rugged. It can also serve as a thermal conduit to dissipate heat produced by the operating electronic device. This cap layer need not be an insulator.

Figure 8:
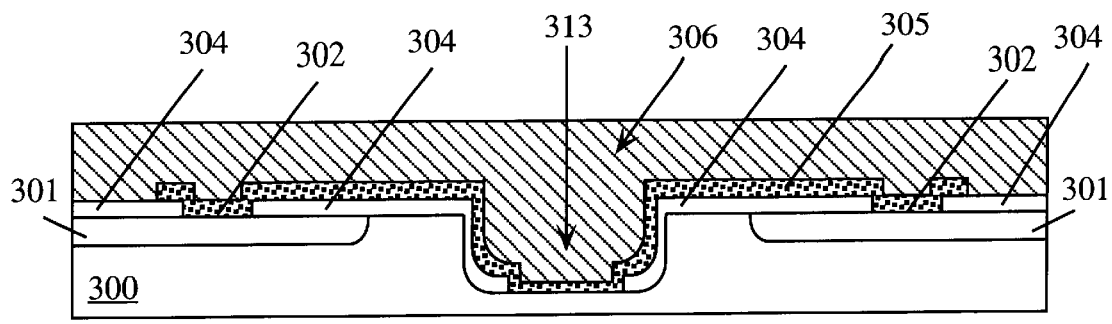
FIG. 8 shows a cross-sectional side view of the wafer portion of the previous Figure after the wafer has been thinned from the bottom to form the bottom surface of the electronic device.

Referring now to FIG. 8, the next step in fabricating a contact is to remove material from the bottom surface of substrate wafer 300 so as to reduce its thickness. Any method of removing substrate material from the back of substrate wafer 300 can be used, such as but not limited to back planing, back lapping, sandblasting, grinding, wet chemical etching, dry plasma etching or the like. The thickness remaining of substrate wafer 300 determines the substrate thickness in the finished device (for example, 100 microns).

Figure 9:
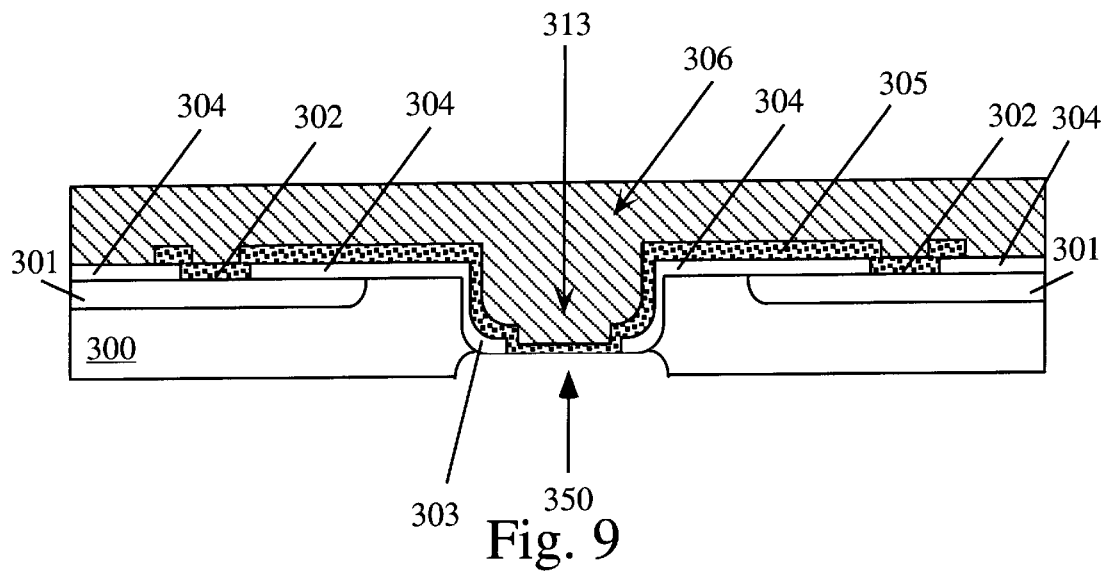
FIG. 9 shows a cross-sectional side view of the wafer portion of the previous Figure after selected portions of the wafers bottom have been further thinned, which exposes the gold wire at the bottom of the protruding encapsulant.

Referring now to FIG. 9, the next step is to selectively remove material from the bottom surface of substrate wafer 300 so as to reduce (by 2 microns, for example) its substrate thickness over encapsulant protrusion 313. Any method of selectively removing substrate material from the back of substrate wafer 300 can be used, such as but not limited to the following: photo-lithographically selective wet chemical etching; photo-lithographically selective dry plasma; ion etching; or the like. In some embodiments, the thinning steps of FIG. 8 and FIG. 9 could be combined into a single step.

Sufficient material must be removed that a portion of interconnection wire 305 is exposed on the bottom or the sides of the encapsulant trench. This back thinning separates substrate wafer 300 into various portions, one for each electronic device being fabricated.

Figure 10:
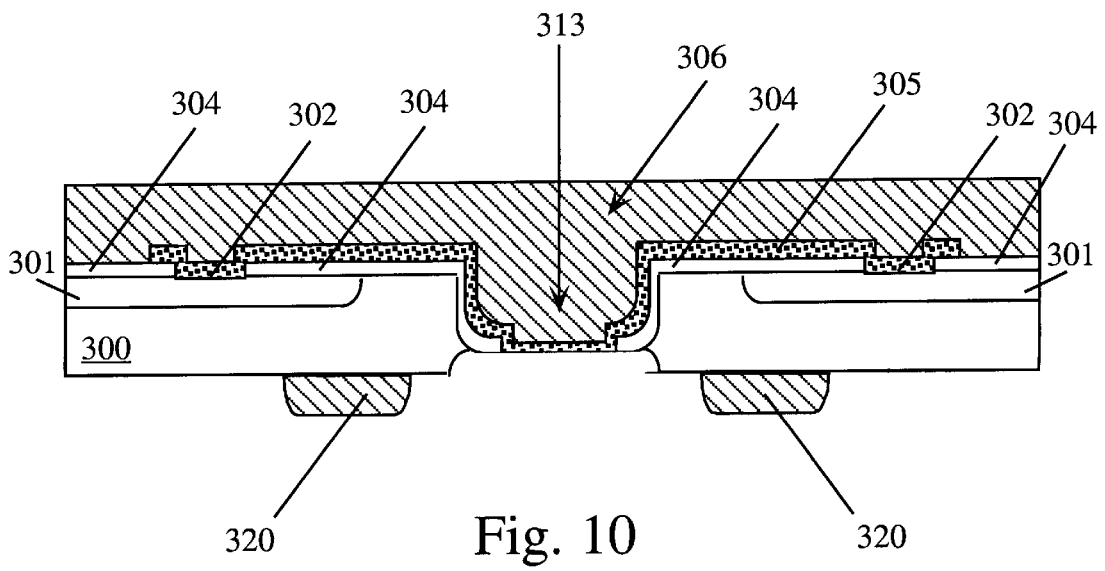
FIG. 10 shows a cross-sectional side view of the wafer portion of the previous Figure after epoxy standoffs have been placed on the bottom surface of the wafer.

Referring now to FIG. 10, the next step is to form standoffs 320 on the bottom surface of substrate wafer 300. Standoffs 320 can be formed of a relatively thick layer (50 microns, for example) of a strong material such as epoxy, glass, plastic, polymide resins, Teflon®, silicon oxide ($SiO_2$), silicon nitride ($Si_3N_4$), mixtures thereof, layers thereof, or any other material that is relatively rigid and strong, and sufficiently flexible or compliant to allow for thermal expansion both in subsequent wafer processing and in the complete electronic system. For example, Hysol® FP4650 epoxy manufactured by Dexter Corp., Electronic Materials Division, of Industry, California, might be suitable for standoffs 320. As an alternative to being compliant, standoffs 320 can be formed of a material with thermal expansion characteristics similar to those of substrate wafer 300.

Standoffs 320 can be applied using a variety of techniques. These techniques may attempt to keep standoffs 320 at a uniform thickness, or to eliminate air bubbles within standoffs 320 or between it and substrate wafer 300. In some embodiments, substrate wafer 300 has standoffs 320 applied to its bottom surface in a screening process or the like is used in which a screen or mask allows an epoxy material to contact the bottom surface of substrate wafer 300 only at those locations where a standoff 320 is to be formed. In other embodiments, substrate wafer 300 has epoxy standoffs 320 applied to its bottom surface from a flexible disk or strip on which the standoffs have been pre-located at the appropriate positions.

Other methods include using photosensitive plastic and printing on the plastic using a jet printer. Shaping can also be done using heat or light. Stand-offs can also include copper ball stand-offs, silicon posts or other methods. Many other methods exist and the present invention is in no way limited to any particular method.

Figure 11:
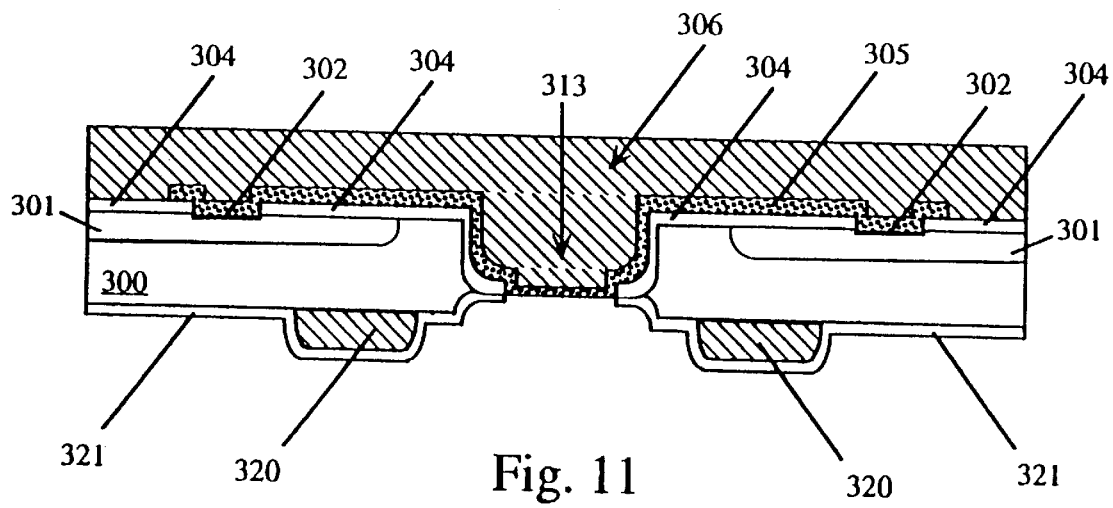
FIG. 11 shows a cross-sectional side view of the wafer portion of the previous Figure after an insulator has been formed on its bottom according to a pattern.

Referring now to FIG. 11, the next step in fabricating a contact is to form lower insulation layer 321 on the bottom surface of substrate wafer 300 according to a pattern. Lower insulation layer 321 must not cover at least a portion of the part of interconnect layer 305 that is exposed on the bottom of the wafer. If substrate 300 is conductive, then lower insulation layer 321 must insulate substrate 300 from contact layer 307, discussed below in connection with FIG. 12, which is formed in the next step. It may be advantageous to have lower insulation layer 321 completely cover standoffs 320 in order to facilitate forming or increase the reliability of contact layer 307.

The above discussion, in connection with FIG. 5, of the materials that can be used and the dimensions of upper insulation layer 304 also apply to lower insulation layer 321.

Referring now to FIG. 12, the next step in fabricating a contact is to selectively form lower wires, lead wires or contact layer 307 (6 to 10 microns thick, for example) on the bottom surface of substrate wafer 300. One portion relative to each finished device, of contact layer 307 connects with the exposed portion of interconnection wire 305. The other ends of contact layer 307 runs onto standoffs 320 and optionally extends over their bottom surface, thus forming the bottom of each contact being fabricated. Contact layer 307 completely covers standoffs 320 and extends beyond them toward the center of each electronic device. Such a large contact surface is optional, thus contact layer 307 may end at the inside edge of standoff 320, or it may only partially cover its bottom surface.

Contact layer 307 is formed from a metal or other conductor that facilitates connecting the contacts of the electronic device with the wiring on the surface to which the device is mounted. In embodiments where soldering is used to form connections, contact layer 307 can be made of an easily solderable conductor such as but not limited to the following: nickel (Ni), nichrome-gold, nichrome-nickel, nickel-arsenic-gold, nickel-arsenic, nickel-gold, gold-tin-oxide (ATO), palladium-silicide, titanium (Ti), tungsten (W), titanium-tungsten (Ti-W), indium titanium oxide (ITO), aluminum (Al), copper (Cu), platinum (Pt), alloys thereof or layers thereof. Gold (Au) or silver (Ag) can also be used for contact layer 307.

Any method of forming contact layer 307 according to a pattern can be used, including but not limited to pattern plating. Pattern plating is not wasteful of materials and can be faster than, and result in a higher quality contact layer 307 than would result from depositing contact layer 307 by evaporation or sputtering.

Various methods of pattern plating are known and can be used to form contact layer 307. One such method is as follows: A first layer (0.2 microns thick, for example) of titanium-tungsten (Ti-W) is deposited on the bottom of substrate wafer 300. A second layer (0.2 microns thick, for example) of gold (Au) is deposited over the first layer. The second layer is then selectively coated by a photo resist layer (6 to 10 microns thick, for example) in the regions where contact layer 307 is not to be formed. Electroplating is then used to form a contact layer 307, which can actually become thicker than the photoresist layer. The photoresist layer is then stripped off and the first and second layers are etched away where they are not protected by contact layer 307.

The contact's bottom surface dimensions can vary from contact to contact. It is not necessary for any contact to have the same width or the same length as any other contact. The inter-contact pitch can be variable.

For some uses of some types of electronic devices, it potentially is a significant advantage to be able to vary the contact's surface area. In the absence of this ability, if the current carrying capacity of a single contact is exceeded, then multiple contacts must be dedicated to carry the same signal or power-supply voltage level. Also, the ability to vary the contact's surface area might help reduce parasitic circuit elements such as resistance and inductance that can be introduced by a contact. Such a reduction could be a significant advantage in some cases, such as for power switching devices.

In some embodiments, the top surface of the electronic devices can be marked while the devices are still attached to the wafer, so as to identify such information as the part type and the orientation of pin number 1. A screening process or the like can be used for that marking.

The electronic devices described throughout this disclosure could possibly be tested while still in wafer form just prior to, or during, a final separation step. If the operation of each device is not affected by its contacts being still connected to those of the adjacent devices, then testing of each electronic device could possibly occur just prior to their being separated into individual devices. It is more common however, to cut and separate the devices before testing.

Alternatively the device separation and testing can occur in three steps:

1) Sawing or etching the wafer from the bottom deep enough to electrically separate the contacts of adjacent devices, but not so deep as to mechanically separate them;
2) Complete separation of the electronic devices; and
3) Testing of each individual electronic device while still on a carrier.

Whether or not an electrical separation step is required, testing while still on the wafer might provide significant cost savings over prior-art techniques, in which typically a wafer is tested and any defective dies within the wafer are marked, then the non-marked dies are assembled into packaged devices, and then the packaged devices are then tested a second time.

Alternatively, the packaged devices can be tested after being separated from the wafer without any wafer testing. If the yield of the wafer is high enough, the wafer testing step might be unnecessary—even if the bad devices were marked it may not be feasible to sort out the good devices for processing that differs from the processing of the bad devices.

Referring now to FIG. 13, the final step in forming a contact according to this embodiment is to separate substrate wafer 300 into individual electronic devices. This separation can be achieved by any method, such as but not limited to sawing, etching, or the like. The separation formed by that sawing or etching forms the outside surface of the finished electronic device.

In some embodiments, the electronic device is now completely packaged, unlike those prior-art techniques in which wafers are separated into dies, which are subsequently assembled into packaged devices. Alternatively, additional test or marking steps might be required. Alternatively, additional device assembly steps might be required in embodiments where contacts on the bottom of the device as disclosed herein are combined with additional contacts on the top of the device that are fabricated using other techniques. For some uses of some types of electronic devices, it may be an advantage that contacts as disclosed herein can be combined in the same electronic device with top-side connections.

Referring now to FIG. 13, a bottom view is also shown of the same electronic device, which is a cross section view taken along line 13(a). The cross section exposes a portion of the multiple rows of contacts is shown along each edge of the electronic device. As shown, there are only a few contacts in each row of the electronic device. In practice, there would be many such contacts in each row and more than one row of contacts on each edge. With variable sized contacts, the contacts may not line up in rows.

For example, a square package with sides of 7.5 millimeters in length (approximately 0.3 inches) could include a total of 300 contacts along its four edges using three contact rows per edge and a pitch of approximately 300 microns between contacts. Also for example, a typical prior-art microprocessor having 200 contacts around the edges of a 38 millimeter square package (approximately 1.5 inches) could be packaged according to the above embodiment, using a relatively conservative inter-contact pitch of approximately 760 microns and only one row of contacts per edge. As another example, an advanced integrated circuit having 1000 contacts around the edges of a 38 millimeter square package would require an inter-contact pitch of approximately 300 microns using two rows along each edge, or an inter-contact pitch of 600 microns using 4 rows of contacts.

An inter-contact pitch of 300 microns is straightforward to achieve using the above substrate post embodiment. In fact, the inter-contact pitch achievable in practice is likely to be limited by circuit board considerations, not the contacts. It may be difficult to reliably fabricate circuit board conductor 109, as illustrated in FIG. 14, with less than 150 microns spacing between conductors that are less than 150 microns in width.

The contact fabricated comprises standoff 320, bottom insulator layer 321 and contact layer 307. The relative simplicity of this contact might help to minimize parasitic elements being introduced into the circuit in which the contact is used. For some uses of some types of devices, including but not limited to power-switching devices and the like, this might be a significant advantage.

Referring now to FIG. 14, the contact of the electronic device can be soldered to circuit board conductor 109 with solder fillet 108. Circuit board conductor 109 has been formed over circuit board substrate 110. Solder fillet 108 provides both mechanical and electrical connection between the contact and the circuit board. Contacts disclosed herein are suitable for connecting with a circuit board using a variety of techniques, such as but not limited to surface mount soldering, gold compression bonding, epoxy, conductive epoxy or the like. The contacts described throughout this disclosure are suitable for connection to a variety of apparatus, including but not limited to circuit boards, glass plates, or the like.

Referring now to FIG. 15, the complete bottom surface of an electronic device similar to that of FIG. 13 is shown further including drop bottom 315. Drop bottom 315 is a protruding portion of substrate 300. Drop bottom 315 is formed by selectively not thinning portions of the bottom of substrate 300 during the selective thinning step discussed above in connection with FIG. 9. This results in drop bottom 315 having a bottom surface approximately co-planar with the bottom of the contacts of the finished electronic device.

Referring now to FIG. 16, the selective thinning provides a stand off between the electronic device and the circuit board to which the device is attached in the region near the contacts. Drop bottom 315 connects with the circuit board or other apparatus to which the electronic device is attached, so that heat can be transferred out of the electronic device and into the circuit board, where the heat might be more easily dissipated without overheating the device.

As shown here, drop bottom 315 has a square bottom surface that forms a significant portion of the bottom surface of substrate 300. Drop bottom 315 could have any shape and could cover more or less area depending on the heat dissipation needs of the electronic device and the heat absorption, transfer and dissipation characteristics of the circuit board or the like to which the device is mounted.

As illustrated in FIG. 16, both drop bottom 315 and the contact of the electronic device can be soldered to circuit board conductors 109 with solder filets 108. Solder filets 108 provide both mechanical connection and heat conduction with drop bottom 315. If substrate 300 is conductive, then the circuit board connector 109 connected to drop bottom 315 should either be electrically isolated or be tied to the substrate voltage appropriate for the electronic device.

Die-Bottom Contacts with a Formed Standoff on an insulative Substrate

Referring now to FIG. 17, a contact for an electronic device using an insulative substrate is shown. The contact comprises a standoff and a wire that extends onto the standoff.

A brief description of how such a contact can be fabricated is as follows:

1) A relatively large trench is formed in the top surface of a substrate, such as but not limited to a semiconductor wafer. The trench may be located near the edge of an electronic circuit or component, such as but not limited to an integrated circuit. The circuit or component is formed using the substrate, or is attached to the substrate.

2) An upper interconnection wire or beam is formed that runs from the connection point into the trench.

3) The top of the substrate is encapsulated, thus forming an encapsulant protrusion in the trench. Optionally, the encapsulant includes a cap layer.

4) The substrate is thinned from the bottom, thus forming the bottom surface of the finished electronic device. The substrate is further selectively thinned from the bottom, thus exposing part of the bottom surface of the upper wire on the encapsulant protrusion.

5) A standoff is applied to or formed on the bottom surface of the substrate.

6) A lower wire or contact layer is formed that runs on the bottom surface of the substrate from the exposed portion of the upper wire and onto the standoff.

7) Optionally, the top surface of the electronic devices are marked, so as to identify the part type and the orientation of pin number 1.

8) The wafer is diced. For some embodiments, this completes the fabrication of the electronic device.

9) Optionally, the electronic devices are tested while still attached to the carrier.

Gallium arsenide is a semiconductor that, unlike silicon, does not significantly conduct electricity unless the gallium arsenide is doped. Patternable insulator layers 304 and 321 are not needed in gallium arsenide embodiments, or in other embodiments where substrate wafer is made of an insulator, such as but not limited to sapphire, quartz or the like. Also, the step of adding a patternable insulator described above in reference to FIG. 5 is not needed. Rather, interconnect wire 305 and contact layer 307 can be insulated from substrate wafer 300 by simply not doping the gallium arsenide substrate in the areas where there is to be no electrical conductivity.

FIG. 17 illustrates the contact that results in embodiments that use gallium arsenide as the substrate. A major difference in the contact shown in FIG. 17 from the contact of FIG. 13 is that insulation layers 304 and 321 are missing. Connection point 310 is formed by doping the gallium arsenide so that it becomes conductive at the point where interconnection wire 305 connects to it.

The process required to produce a contact according to this insulative substrate embodiment is even simpler than that disclosed for conductive substrates. Such simplicity may result in advantages such as reduced cost and higher yield. Also, the resulting contact has even fewer elements than for conductive substrates, which may help Improve the reliability of the contact.

Die-Bottom Contacts with a Substrate Standoff

Figure 22A:
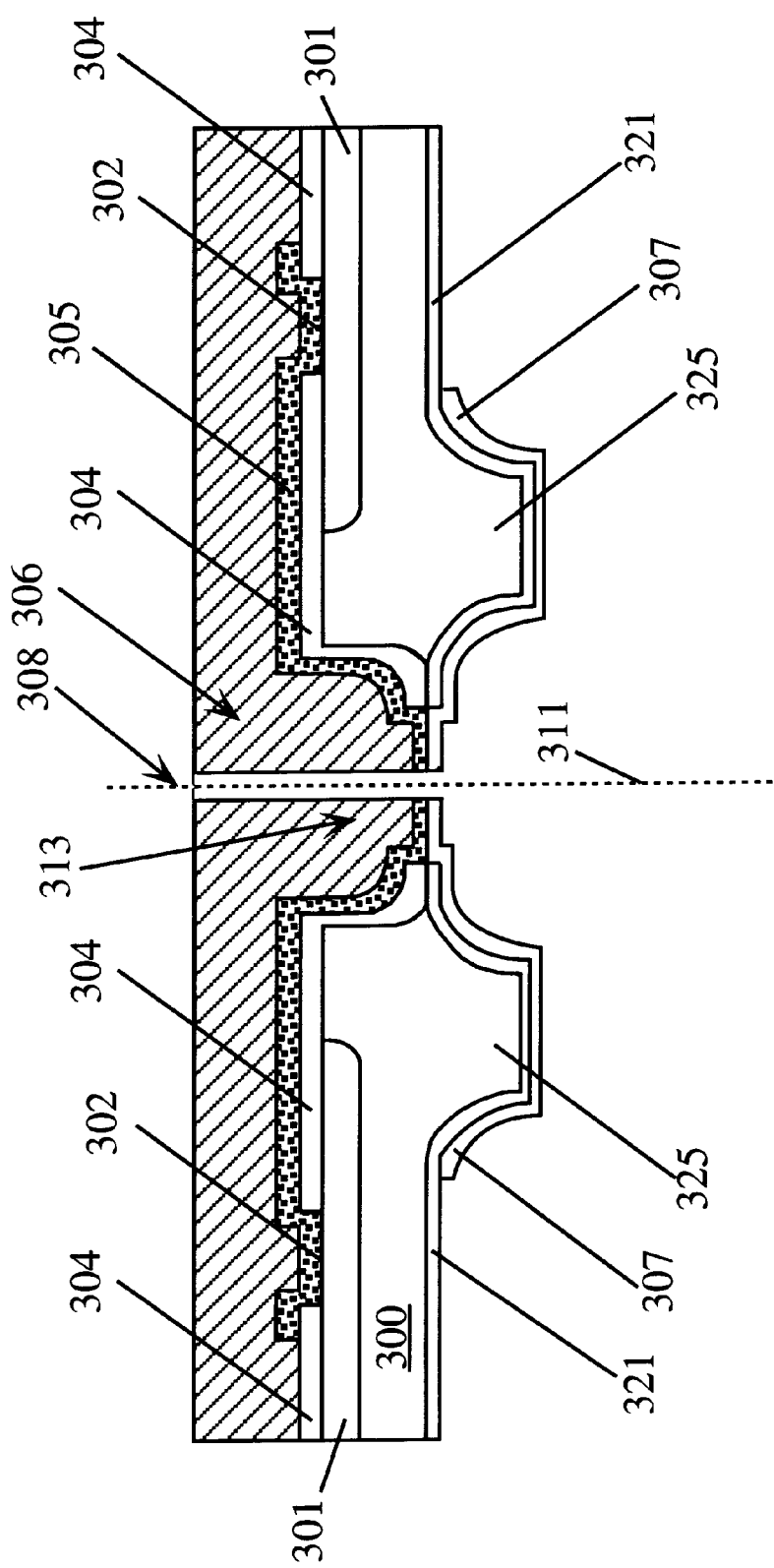
FIGS. 22(a and 22(b) show a cross-sectional side view of the wafer portion of the previous Figure after it has been sawed into two electronic devices each with an attached contact and a corresponding partial bottom view of these same two electronic devices, each with multiple contacts in a two dimensional array.
Figure 22B:
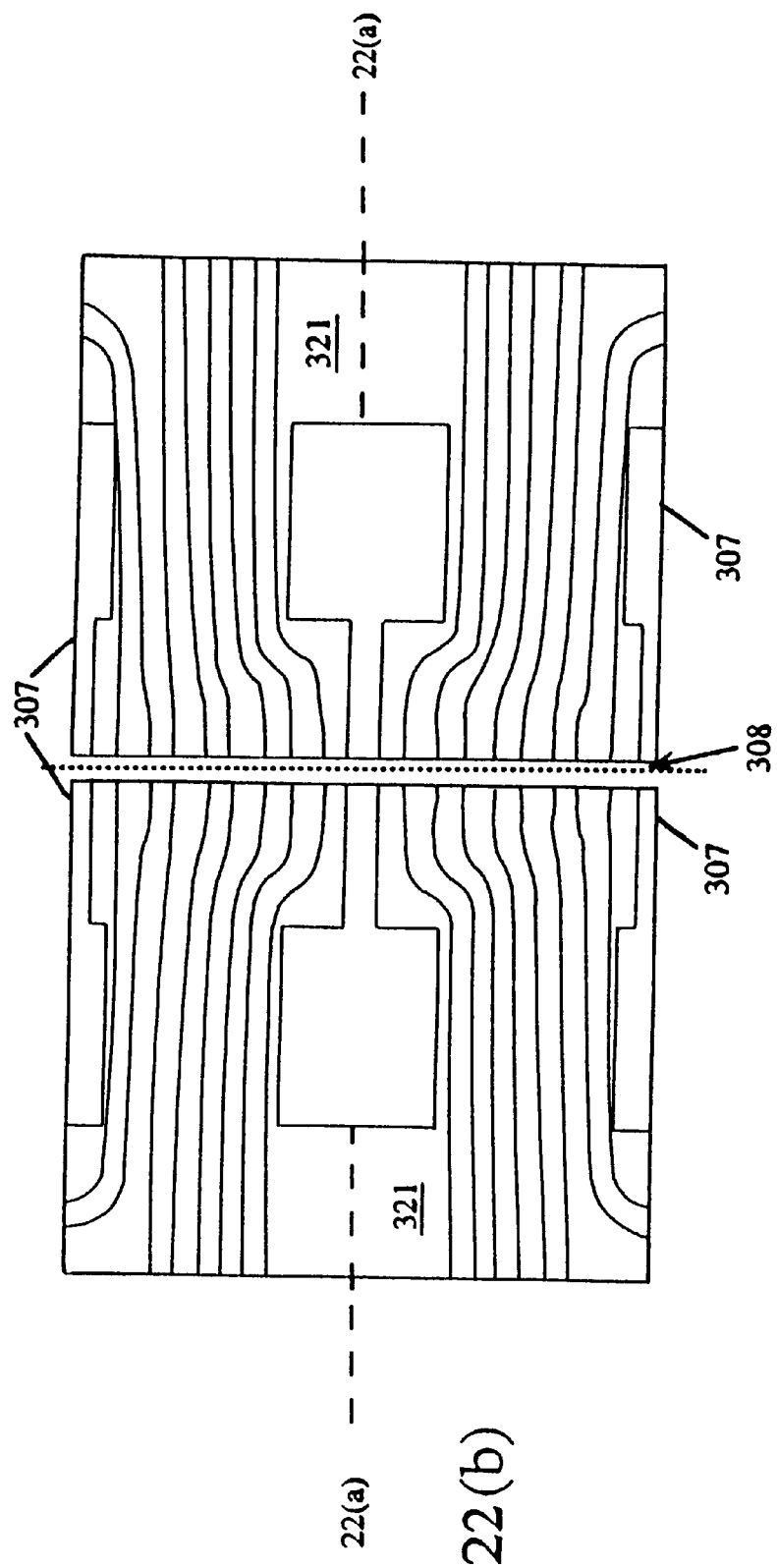

A contact comprising a substrate standoff, a wire that runs onto it and an insulation layer formed there between is shown in FIG. 22. An example of how such contacts are fabricated is shown in FIG. 3 though FIG. 7 and FIG. 18 though FIG. 22. FIG. 3 through FIG. 7 and the steps and materials they represent and involve are discussed in more detail above.

A brief description of how such a contact can be fabricated is as follows:

1) A relatively large trench is formed in the top surface of a substrate, such as but not limited to a semiconductor wafer. The trench may be located near the edge of an electronic circuit or component, such as but not limited to an integrated circuit. The circuit or component is formed using the substrate, or is attached to the substrate.

2) An upper insulation layer is formed that has a through hole over a connection point within the circuit. The insulation layer ends part way through the trench.

3) An upper or interconnection wire is formed that runs from the connection point into the trench.

4) The top of the substrate is encapsulated, thus forming an encapsulant protrusion in the trench. Optionally, the encapsulant includes a cap layer.

5) The substrate is thinned from the bottom, thus forming the bottom surface of the substrate standoff. The substrate is further selectively thinned from the bottom, thus exposing part of the bottom surface of the upper wire on the encapsulant protrusion and forming the sidewalls of the substrate standoff.

6) A lower insulation layer is formed that has a through hole over the exposed portion of the upper wire.

7) A lower wire or contact layer is formed that runs on the bottom surface of the substrate from the exposed portion of the upper wire and onto the standoff.

8) Optionally, the top surface of the electronic devices are marked, so as to identify the part type and the orientation of pin number 1.

9) The wafer is diced. For some embodiments, this completes the fabrication of the electronic device.

10) Optionally, the electronic devices are tested while still attached to a carrier.

Figure 18:
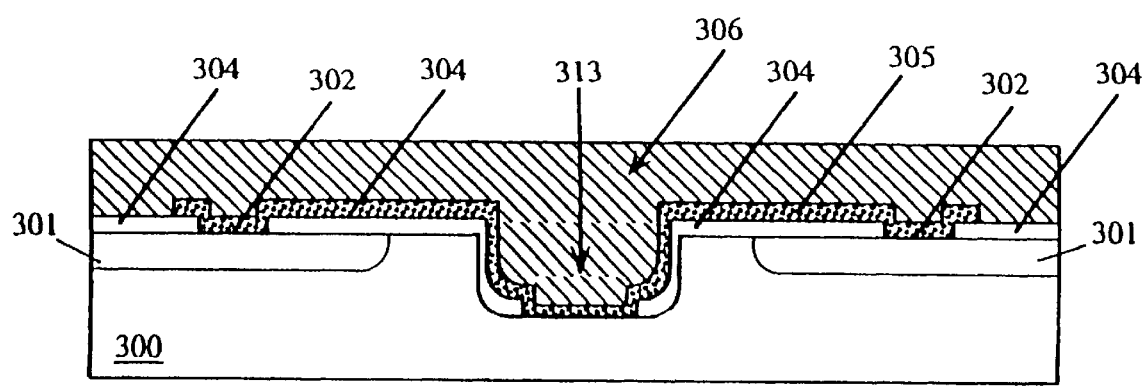
FIG. 18 illustrates a cross-sectional side view according to an alternative method in which the wafer portion of FIG. 7 is next thinned from the bottom to form the bottom surface of substrate posts.

Referring now to FIG. 18, the next step in fabricating a contact is to take substrate wafer 300, as shown in FIG. 7, and remove material from its bottom surface so as to reduce its thickness. Any method of removing substrate material from the back of substrate wafer 300 can be used, such as but not limited to back planing, back lapping, sandblasting, grinding, wet chemical etching, dry plasma etching or the like.

As will become clear, the thickness remaining of substrate wafer 300 determines the height of the substrate standoff in the contact in the finished device. For example, thinning the substrate wafer to a thickness of 150 microns allows a substrate thickness of 100 microns in the finished packaged device and a 50 micron standoff between the bottom surface of the contacts and the bottom surface of the device.

Figure 19:
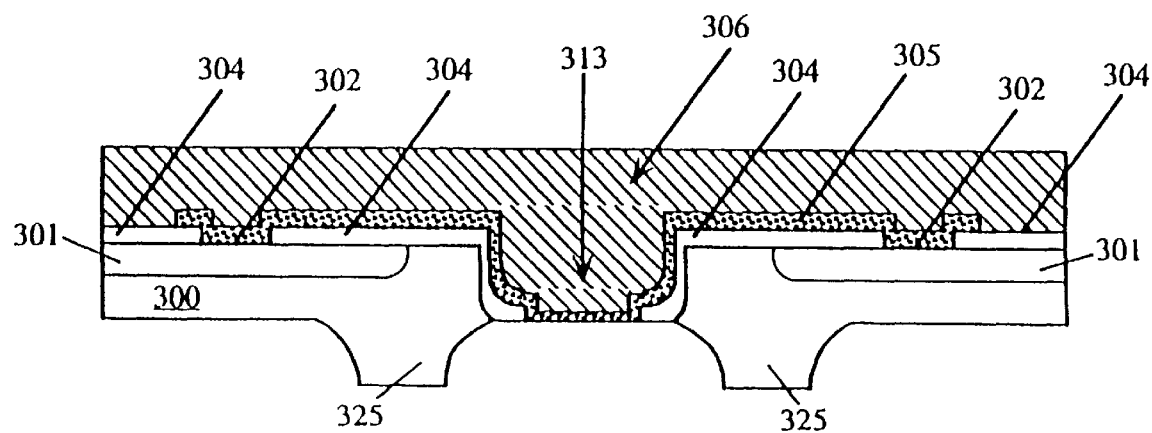
FIG. 19 shows a cross-sectional side view of the wafer portion of the previous Figure after selected portions of it have been further thinned, which exposes the bottom of the gold wire and which forms the substrate posts.

Referring now to FIG. 19, the next step is to selectively remove material from the bottom surface of substrate wafer 300 so as to reduce its substrate thickness over encapsulant protrusion 313 and so as to form the sidewalls of substrate standoffs 325 similar to drop bottoms 315 of FIGS. 15 and 16. Any method of selectively removing substrate material from the back of substrate wafer 300 can be used, such as but not limited to the following: photo-lithographically selective wet chemical etching; photo-lithographically selective dry plasma; ion etching; or the like. In some embodiments, the thinning steps of FIG. 18 and FIG. 19 could be combined into a single step.

Sufficient material must be removed that a portion of interconnection wire 305 is exposed on the bottom or the sides of the encapsulant trench. This back thinning separates substrate wafer 300 into two portions, one for each finished electronic device. Also, sufficient material must be removed that substrate standoffs 325 reach the desired height (for example, 50 microns).

Figure 20:
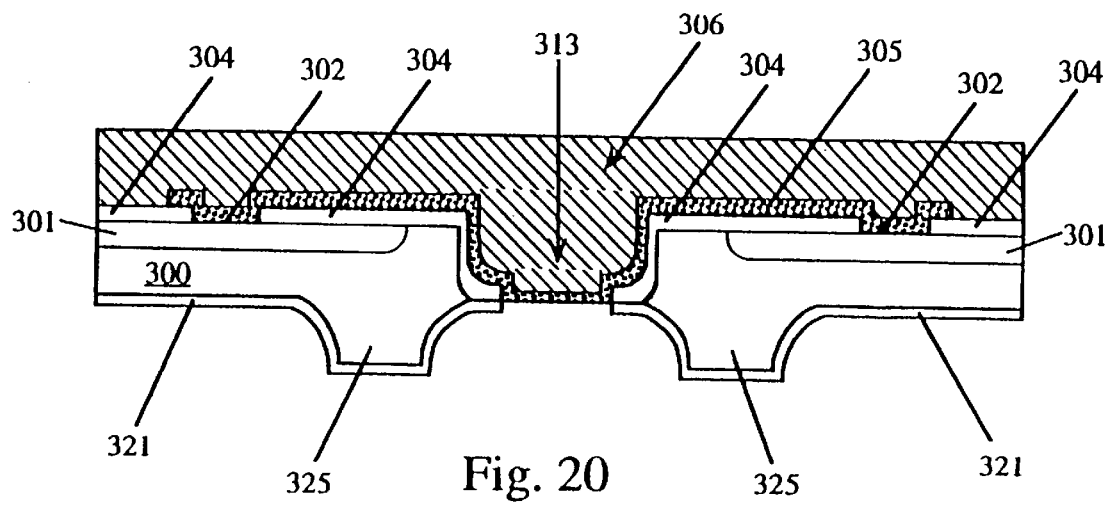
FIG. 20 shows a cross-sectional side view of the wafer portion of the previous Figure after an insulator has been formed on the bottom of the wafer according to a pattern.

Referring now to FIG. 20, the next step in fabricating a contact is to form lower insulation layer 321 on the bottom surface of substrate wafer 300 according to a pattern. Lower insulation layer 321 is discussed above in reference to FIG. 11.

Figure 21:
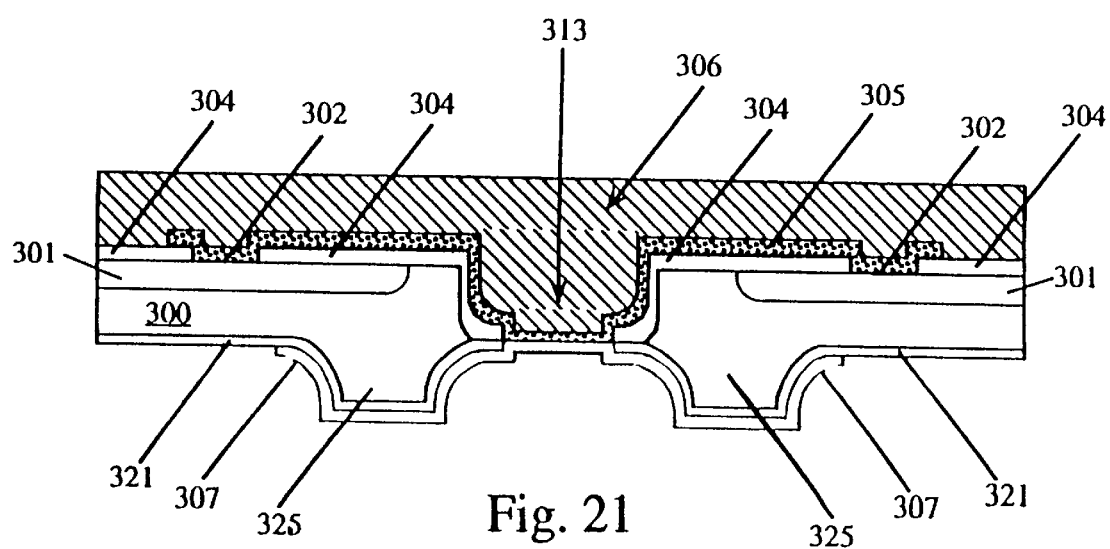
FIG. 21 shows a cross-sectional side view of the wafer portion of the previous Figure after a contact wire has been formed on the bottom of the wafer.

Referring now to FIG. 21, the next step in fabricating a contact is to form lower wire or contact layer 307 on the bottom surface of substrate wafer 300 according to a pattern. Contact layer 307 is discussed above in connection with FIG. 12.

The final step in fabricating a contact according to this embodiment is to separate substrate wafer 300 into individual electronic devices, as Illustrated in FIG. 22. FIG. 22 illustrates a cross sectional side view of the wafer of the previous Figure after being sawed, etched, or otherwise separated into two finished devices, each with an attached contact. FIG. 22 also shows a partial bottom view of the same two devices of the previous Figure, the previous Figure being a cross section view taken along line 22(a). Each device has multiple contacts arranged in multiple rows along each edge of the device.

In some embodiments, the electronic device is now completely packaged, unlike those prior-art techniques in which wafers are separated into dies, which are subsequently assembled into packaged devices. Alternatively, additional test or marking steps might be required. Alteratively, additional device assembly steps might be required in embodiments where contacts on the bottom of the device as disclosed herein are combined with additional contacts on the top of the device that are fabricated using other techniques. For some uses of some types of electronic devices, it is a potential advantage that contacts as disclosed herein can be combined in the same electronic device with top-side connections.

Die-Bottom Contacts with a Substrate Standoff on an insulative Substrate

Figure 23A:
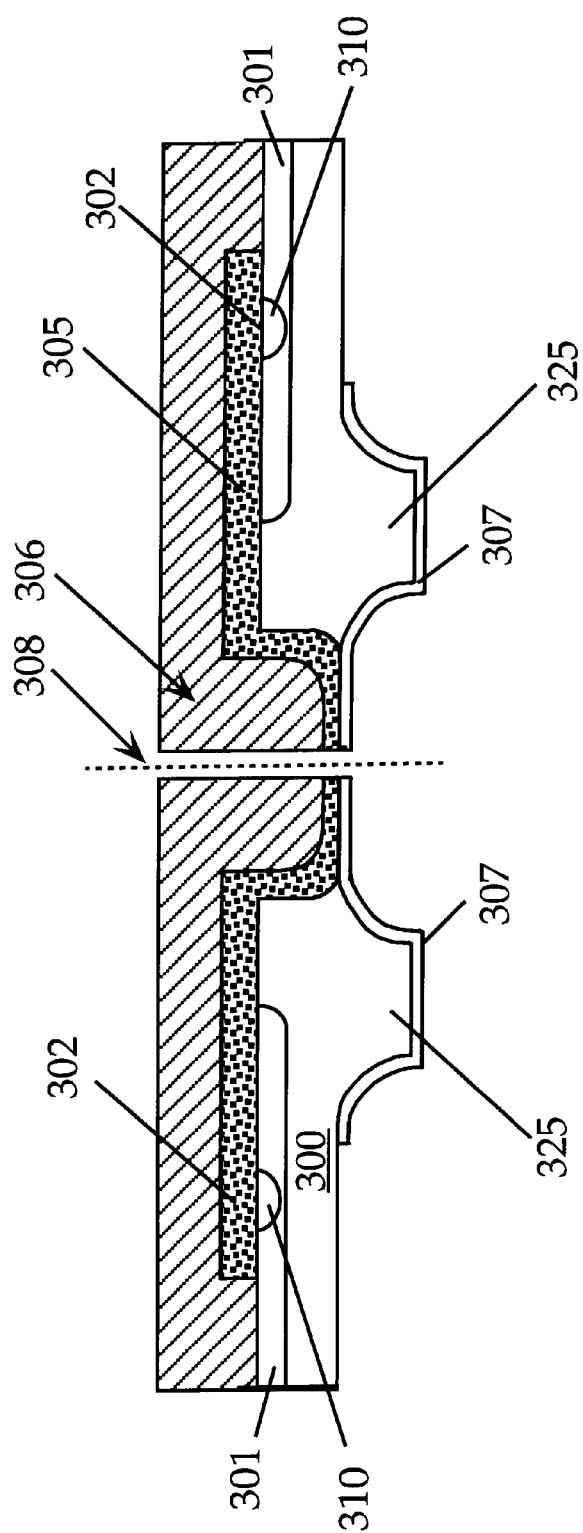
FIGS. 23(a) and 23(b) show a cross-sectional side view of two electronic devices and contacts comparable to those of the previous Figure, but made using a gallium arsenide substrate wafer for which no insulator is necessary.
Figure 23B:
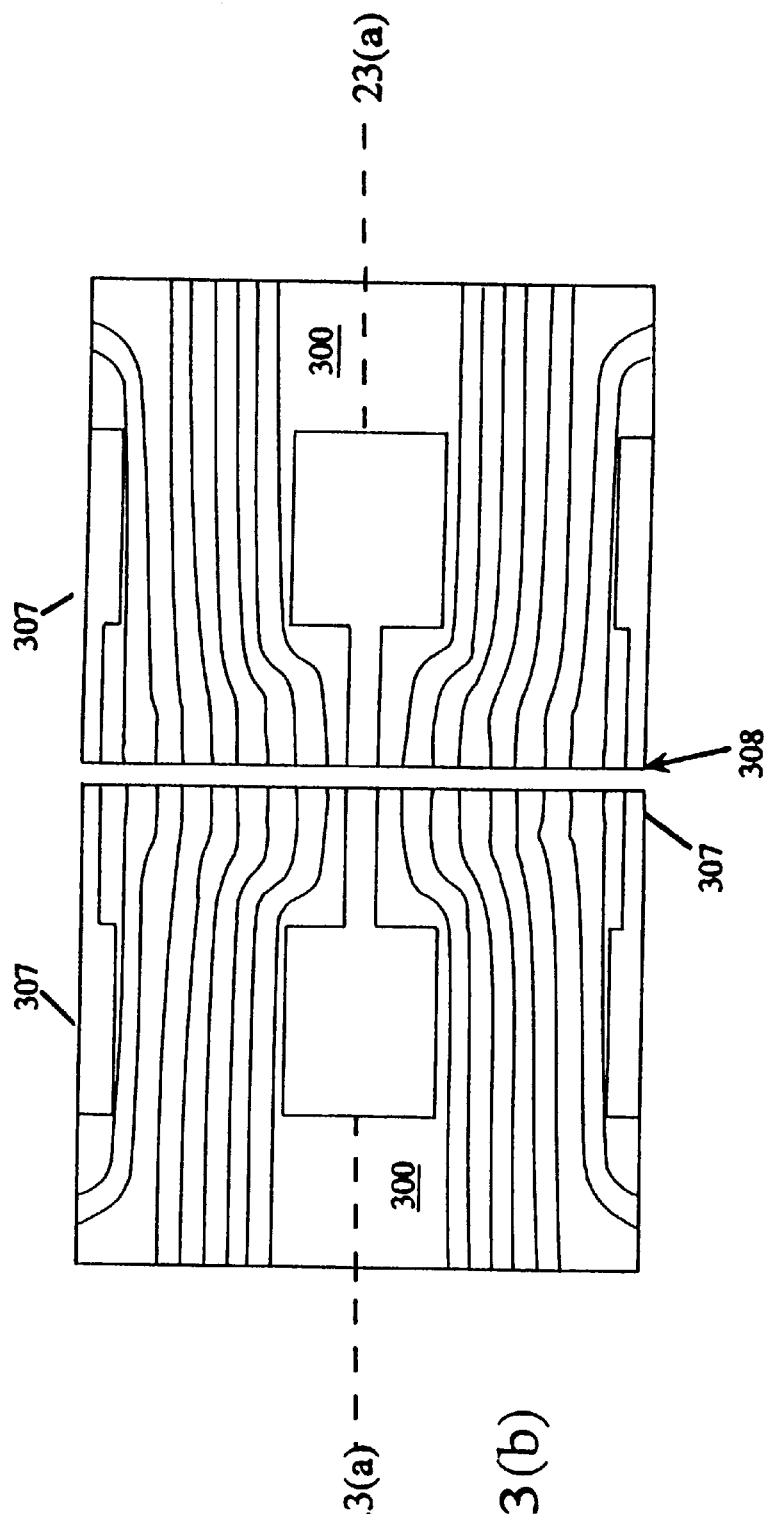
Figure 24:
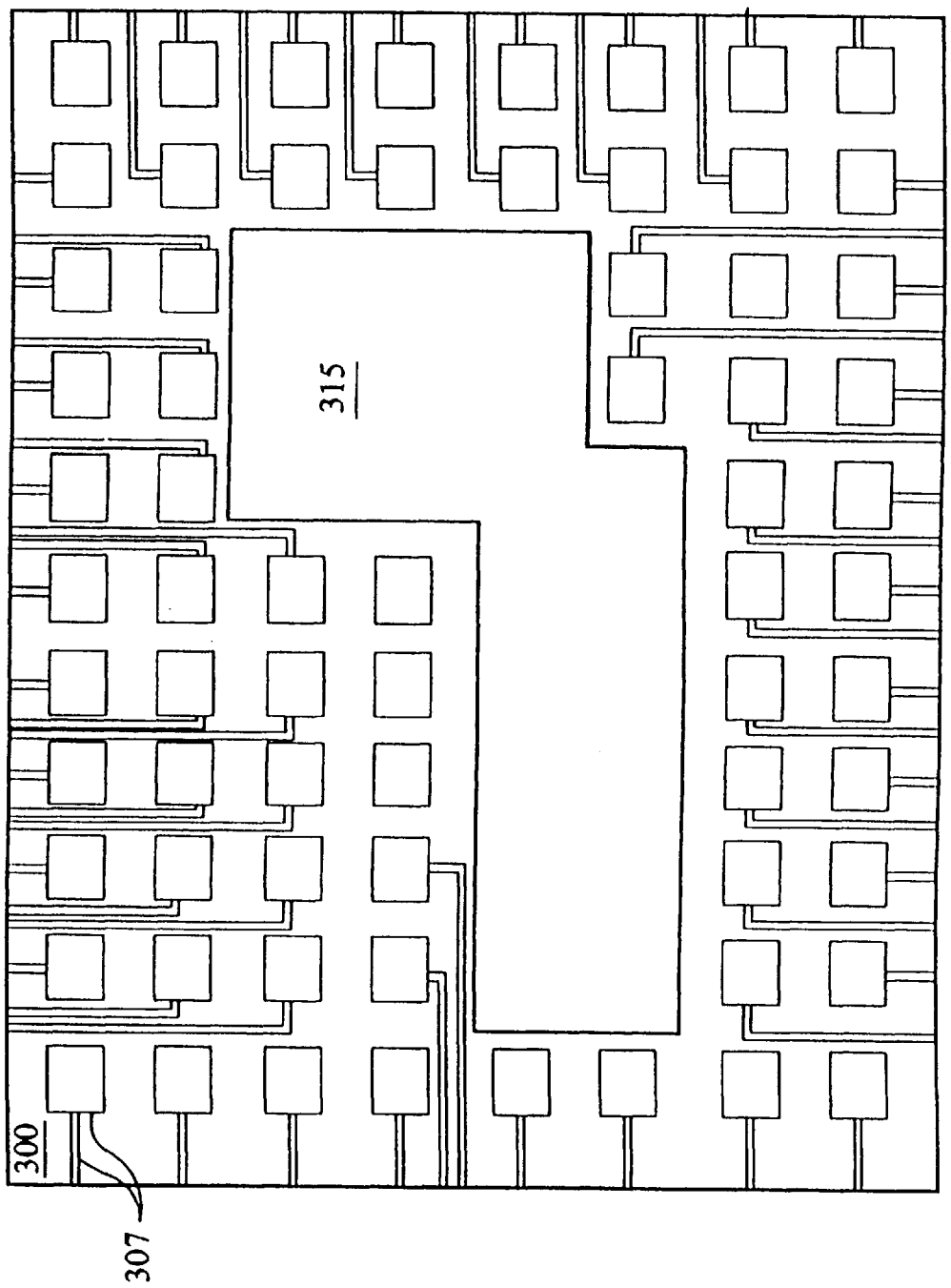
FIG. 24 shows a complete bottom view of the electronic device of the previous Figure, with multiple contacts in a two dimensional array and with a bottom substrate surface that drops down, according to an irregular shape, to circuit-board level to transfer heat generated in the electronic device to the circuit board.

A contact for an electronic device using an insulative substrate is illustrated in FIG. 23 and FIG. 24. The contact comprises a substrate standoff and a contact layer or lower wire that extends onto the standoff.

A brief description of how such a contact can be fabricated is as follows:

1) A relatively large trench is formed in the top surface of a substrate, such as but not limited to a semiconductor wafer. The trench may be located near the edge of an electronic circuit or component, such as but not limited to an integrated circuit. The circuit or component is formed using the substrate, or is attached to the substrate.

2) An upper interconnection wire or beam is formed that runs from the connection point into the trench.

3) The top of the substrate is encapsulated, thus forming an encapsulant protrusion in the trench. Optionally, the encapsulant includes a cap layer.

4) The substrate is thinned from the bottom, thus forming the bottom surface of the finished electronic device. The substrate is further selectively thinned from the bottom, thus exposing part of the bottom surface of the upper wire on the encapsulant protrusion and forming the substrate standoff.

5) A lower wire or contact layer is formed that runs on the bottom surface of the substrate from the exposed portion of the upper wire and onto the standoff.
6) Optionally, the top surface of the electronic devices are marked, so as to identify the part type and the orientation of pin number 1.
7) The wafer is diced. For some embodiments, this completes the fabrication of the electronic device.
8) Optionally, the electronic devices are tested while still attached to a carrier.

Gallium arsenide is a semiconductor that, unlike silicon, does not significantly conduct electricity unless the gallium arsenide is doped. Patternable insulator layers 304 and 321 are not needed in gallium arsenide embodiments, or in other embodiments where substrate wafer is made of an insulator, such as but not limited to sapphire, quartz or the like. Also, the steps of adding patternable insulators described above in reference to FIG. 5 and FIG. 20 are not needed. Rather, interconnect wire 305 and contact layer 307 can be insulated from substrate wafer 300 by simply not doping the gallium arsenide substrate in the areas where there is to be no electrical conductivity.

FIG. 23 illustrates the contact that results in embodiments that use gallium arsenide as the substrate. A major difference from the contact of FIG. 22 is that insulation layers 304 and 321 are missing. Connection point 310 is formed by doping the gallium arsenide so that it becomes conductive at the point where interconnection wire 305 connects to it.

The process required to produce a contact according to this insulative substrate embodiment is even simpler than that disclosed for conductive substrates. Such simplicity may result in advantages such as reduced cost and higher yield. Also, the resulting contact has even fewer elements than for conductive substrates, which may help improve the reliability of the contact.

FIG. 24 illustrates an electronic device similar to that of the previous Figure, except that it includes an irregularly shaped drop bottom 315. Drop bottom 315 is a protruding portion of substrate 300. It has a bottom surface approximately co-planar with the bottom of the contacts of the finished electronic device. Drop bottom 315 is discussed above in connection with FIG. 15.

As shown here, drop bottom 315 has an Irregular shaped bottom surface, perhaps designed so that drop bottom 315 protrudes beneath those portions of the electronic circuit or device that produce substantial heat. Drop bottom 315 could have any shape and could cover more or less area depending on the heat dissipation needs of the electronic device and the heat absorption, transfer and dissipation characteristics of the circuit board or other apparatus to which the device is mounted.

Figure 25:
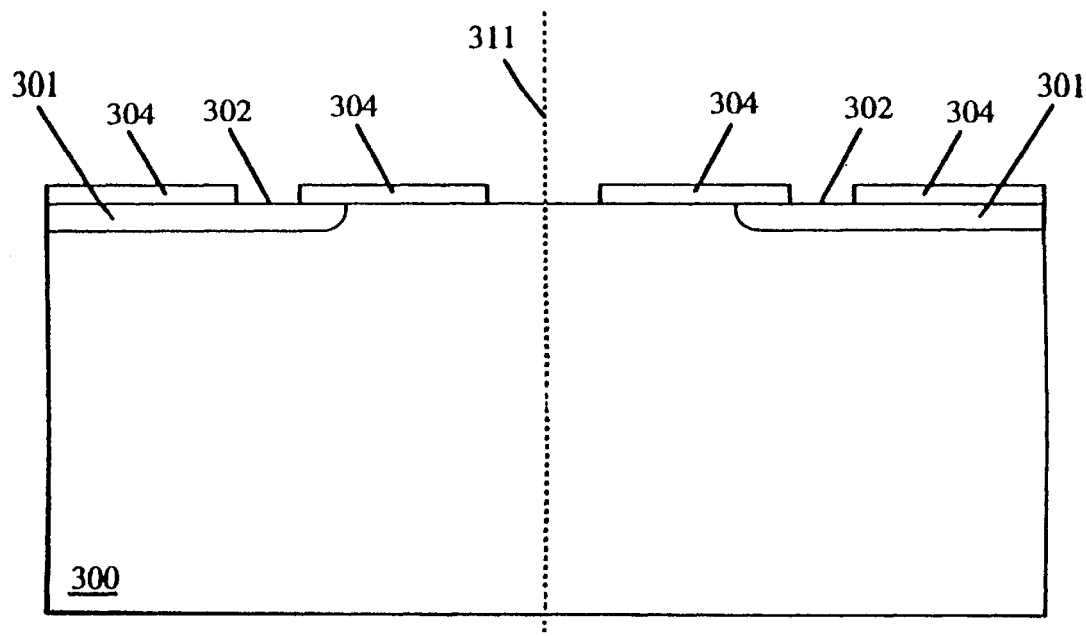
FIG. 25 illustrates a cross-sectional side view according to an alternative method in which the wafer portion of FIGS. 3(a) and 3(b) next has an insulator formed on selected portions of its top surface according to a pattern.
Figure 33A:
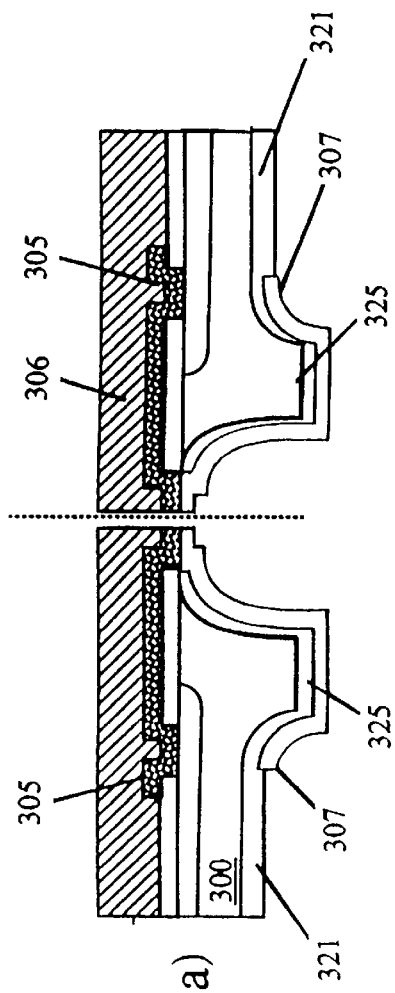
FIGS. 33(a) and 33(b) show a cross-sectional side view of the wafer portion of the previous Figure after it has been sawed into two electronic devices each with an attached contact and a corresponding partial bottom view of the same two electronic devices, each with multiple contacts in a two dimensional array.
Figure 33B:
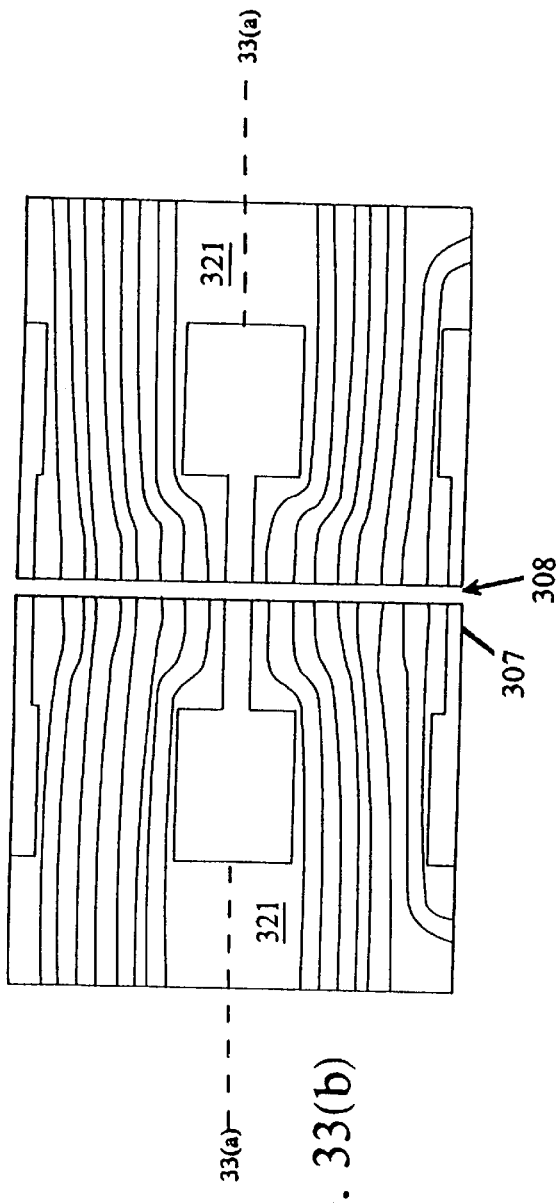
Figure 34:
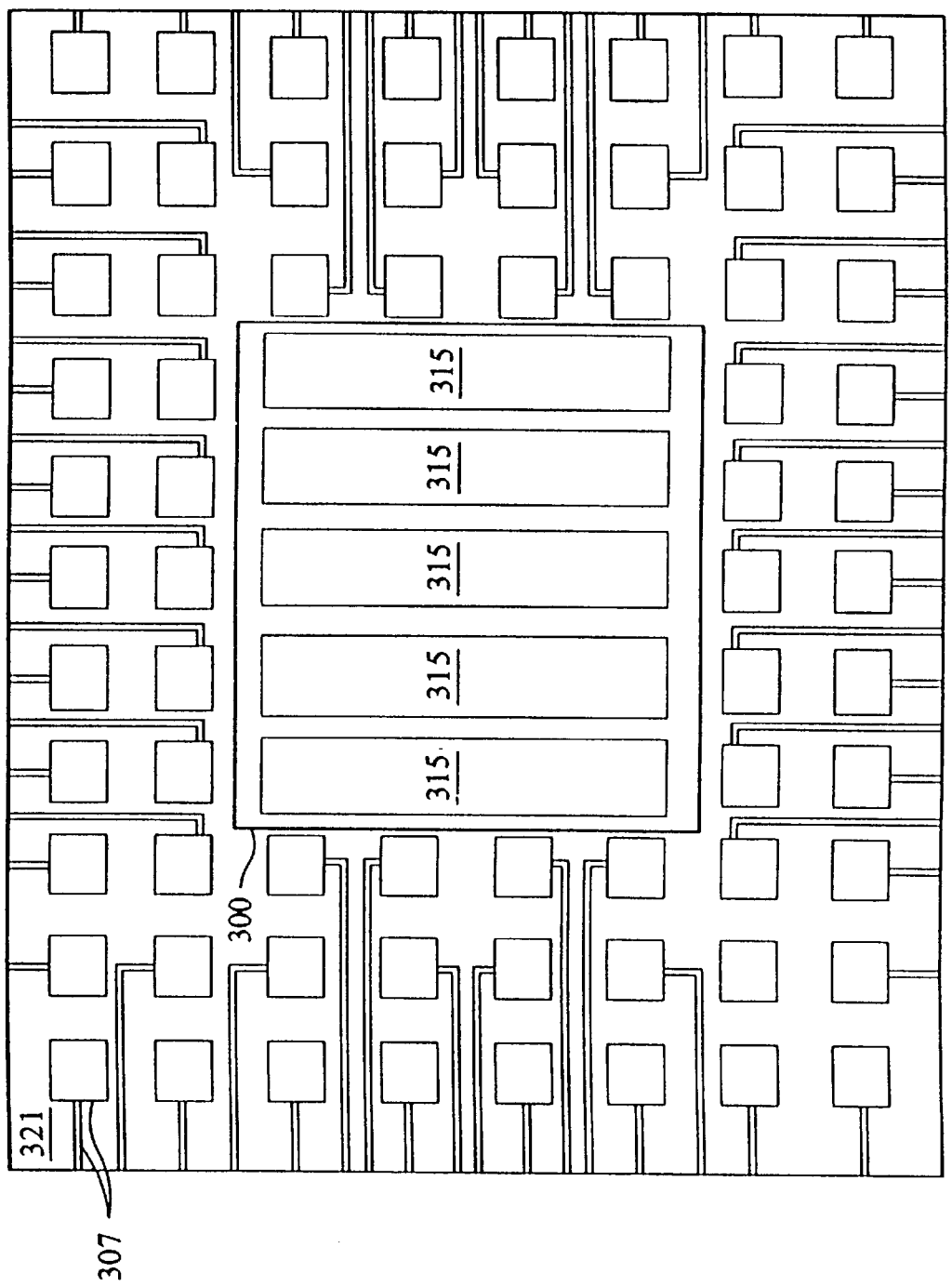
FIG. 34 shows a complete bottom view of one of the electronic devices of the previous Figure, with multiple contacts in a two dimensional array and with a bottom substrate surface that drops down in a ribbed pattern to circuit-board level to transfer heat generated in the electronic device to the circuit board.

Die-Bottom Contacts with a Substrate Standoff Fabricated using a Single Bottom-Surface Trench A contact comprising a substrate standoff, a wire that runs onto it and an insulation layer there between is illustrated in FIG. 33 and FIG. 34. How such contacts are fabricated is shown in FIG. 3 and FIG. 25 though FIG. 34.

A brief description of how such a contact can be fabricated is as follows:

1) An upper insulation layer is formed on the top surface of a substrate, such as but not limited to a semiconductor wafer. The circuit or component that will make up the finished electronic device (such as but not limited to an integrated circuit) is formed using the substrate, or is attached to the substrate. The upper insulation layer has a through hole over a connection point within the circuit. Also, the insulation layer ends prior to the plane that will separate adjacent electronic devices.
2) An upper interconnection wire or beam is formed that runs from the connection point to the separation plane.
3) The top of the substrate is encapsulated. Optionally, the encapsulant includes a cap layer.
4) The substrate is thinned from the bottom, thus forming the bottom surface of the substrate standoff. The substrate is further selectively thinned from the bottom, thus forming the sidewalls of the substrate standoff. This selective thinning also forms a relatively large trench in the bottom surface of the substrate, thus exposing part of the bottom surface of the upper wire. This selective thinning may be performed by first making a saw cut along the device separation plane and then etching.
5) A lower insulation layer is formed that has a through hole over the exposed portion of the upper wire.
6) A lower wire or contact layer is formed that runs on the bottom surface of the lower insulation layer from the exposed portion of the upper wire and onto the standoff.
7) Optionally, the top surface of the electronic devices are marked, so as to identify the part type and the orientation of pin number 1.
8) The wafer is diced. For some embodiments, this completes the fabrication of the electronic device.
9) Optionally, the electronic devices are tested while still attached to a carrier.

Considering this fabrication process in more detail, a description of the initial step of this fabrication process can be found in reference to FIG. 3 above.

Continuing on with the process by referring to FIG. 25, the top of the wafer shown in FIG. 3 is selectively coated with insulation layer 304 insulation layer 304 is discussed above in connection with FIG. 5.

Figure 26:
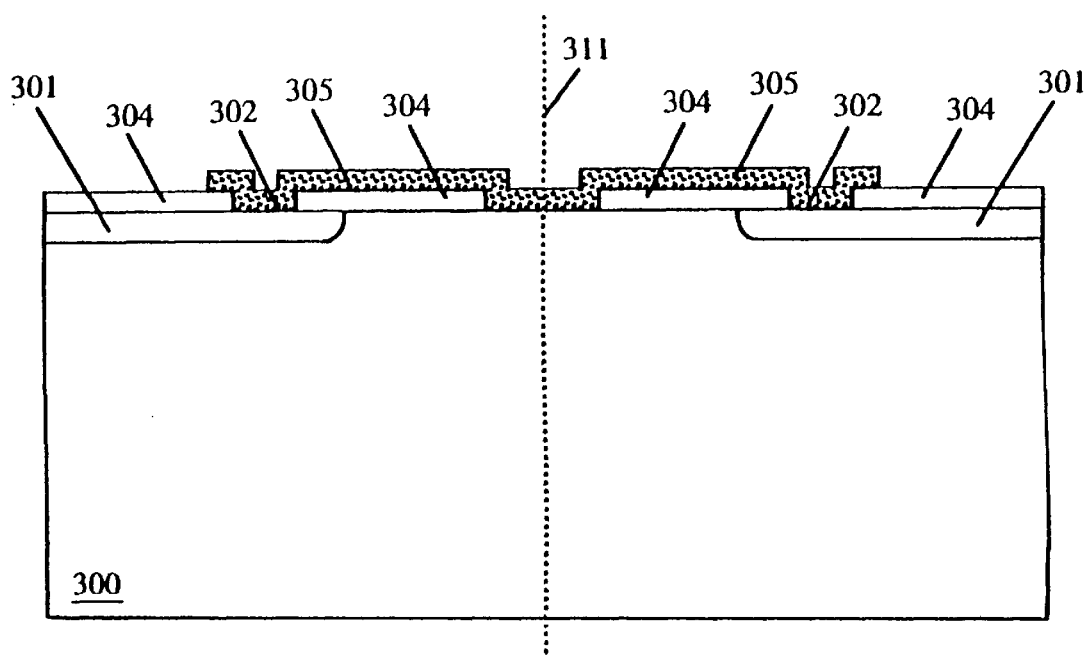
FIG. 26 shows a cross-sectional side view of the wafer portion of the previous Figure after a gold wire has been formed on top of the wafer and the insulator.

The next step, as illustrated in FIG. 26, a beam or an upper interconnection wire 305 is formed. Interconnection wire 305 extends from connection point 302 within electronic circuit region 301 into the non-insulated portion of trench 303 (for example, 6 to 10 microns thick and 10 microns wide, or a width going up to whatever is appropriate for the current carried). Interconnection wire 305 is discussed above in connection with FIG. 6.

Figure 27:
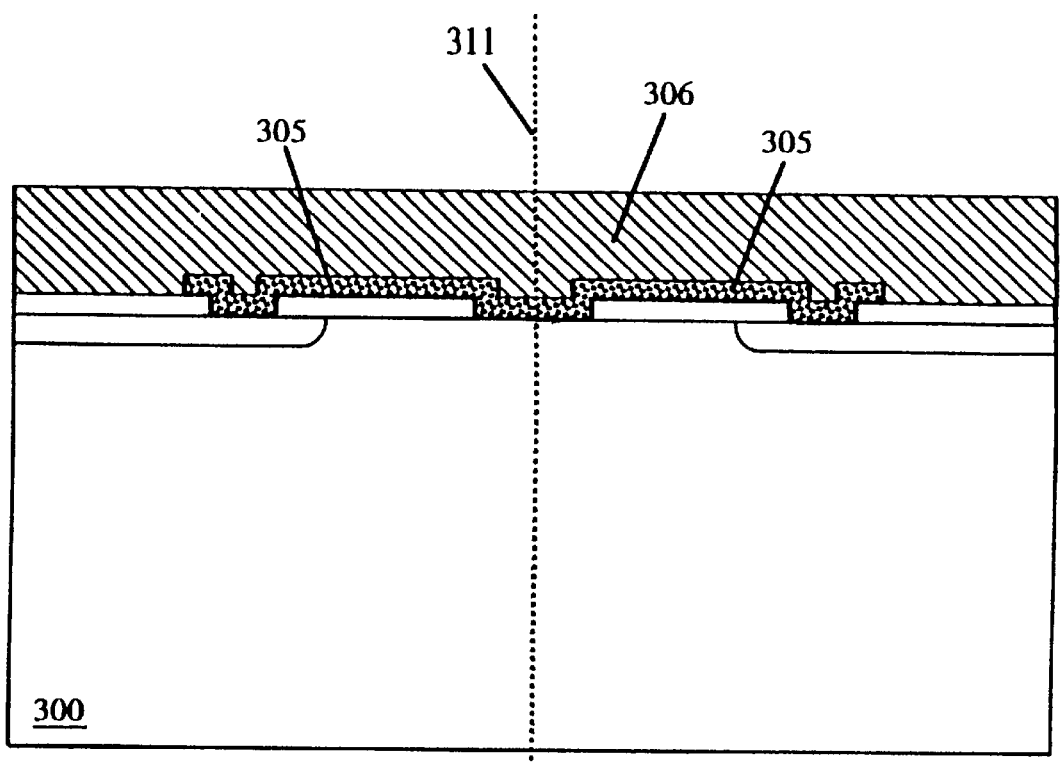
FIG. 27 shows a cross-sectional side view of the wafer portion of the previous Figure after a relatively thick layer of epoxy has been applied to the top of the wafer, the insulator, and the gold wire, which encapsulates them into a strong and rigid unit.

Referring now to FIG. 27, in the next step, substrate wafer 300, insulating layer 304 and interconnection wire 305 are encapsulated. The top surfaces of these structures are covered with a relatively thick layer (150 microns, for example) of a strong and insulative encapsulant. Encapsulant layer 305 is discussed above in connection with FIG. 7.

Figure 28:
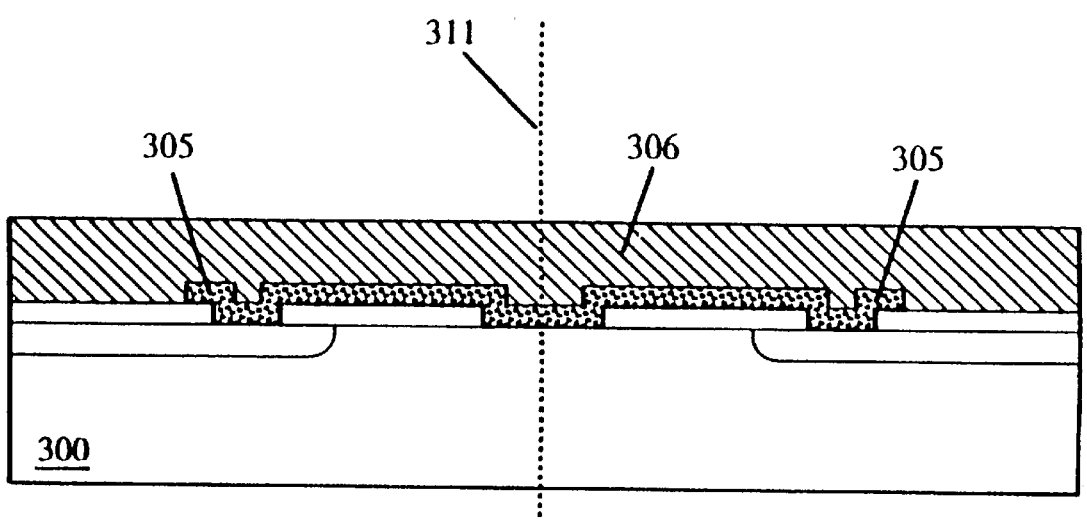
FIG. 28 shows a cross-sectional side view of the wafer portion of the previous Figure after it has been thinned from the bottom to form the bottom surface of substrate posts.

Referring now to FIG. 28, in the next step substrate wafer 300 then is thinned from its bottom surface so as to reduce its thickness. Any method of removing substrate material from the back of substrate wafer 300 can be used, such as but not limited to back planing, back lapping, sandblasting, grinding, wet chemical etching, dry plasma etching or the like.

As will become clear, the thickness remaining of substrate wafer 300 determines the height of the substrate standoff in the contact in the finished device. For example, thinning the substrate wafer to a thickness of 150 microns allows a substrate thickness of 100 microns in the finished device and a 50 micron standoff between the bottom surface of the contacts and the bottom surface of the device.

The next step is to selectively remove material from the bottom surface of substrate wafer 300 so as to reduce Its substrate thickness along separation plane 311. Any method of selectively removing substrate material from the back of substrate wafer 300 can be used, such as but not limited to the following: diamond saw cutting, photo-lithographically selective wet chemical etching; photo-lithographically selective dry plasma; ion etching; or the like.

Figure 29:
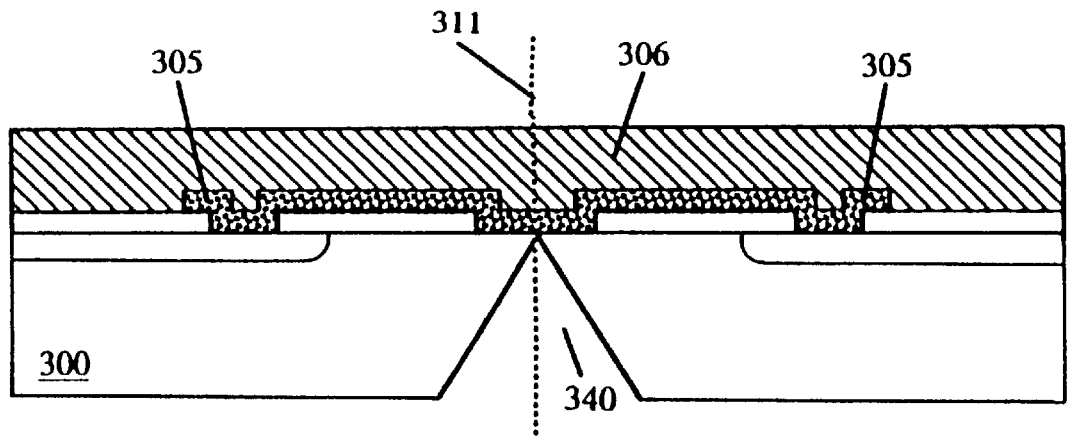
FIG. 29 shows a cross-sectional side view of the wafer portion of the previous Figure after a notch has been cut in its bottom surface between adjacent electronic circuits.
Figure 30:
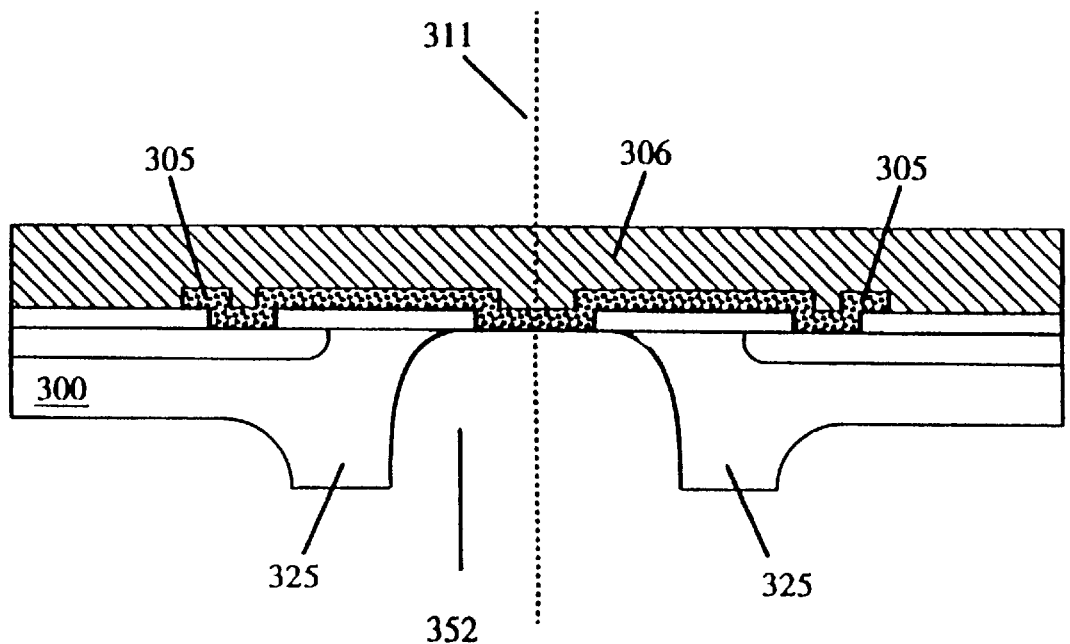
FIG. 30 shows a cross-sectional side view of the wafer portion of the previous Figure after it has been further thinned selectively from the bottom, which separates the substrate regions of adjacent electronic circuits and which forms the silicon posts.

As illustrated in FIG. 29 and FIG. 30, first a diamond-shaped saw cut can be made and then selective etching can be used to broaden the cut and to form the substrate standoffs. In some embodiments, the thinning steps of FIG. 29 and FIG. 30 could be combined into a single step.

Sufficient material must be removed that a portion of interconnection wire 305 is exposed on the bottom or the sides of the encapsulant trench. Also, sufficient material must be removed that substrate standoffs 325 reach the desired height (for example, 50 microns). This back thinning separates substrate wafer 300 into a separate portion for each finished electronic device.

Figure 31:
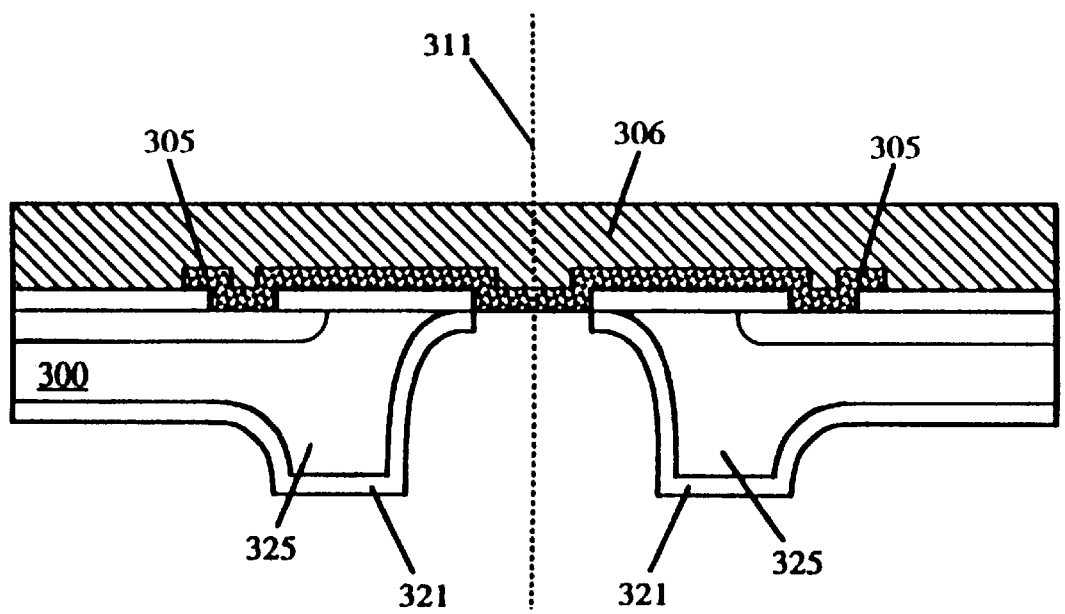
FIG. 31 shows a cross-sectional side view of the wafer portion of the previous Figure after an insulator has been formed on the bottom of the wafer according to a pattern.

Referring again to FIGS. 4 and 9, the top trench 303 shown first in FIG. 4 and again in FIG. 9 can be accomplished using the same technique as that discussed above in relation to saw cut 340 shown in FIG. 29 and trench 352 shown in FIG. 31. First, the top trench 303 could first be cut with the diamond-shaped saw cut such as saw-cut 340 of FIG. 29 to reduce its substrate thickness. Then, selective etching can be used to broaden trench 303 to the shape shown in FIG. 4. Similarly, the bottom trench 350 shown in FIG. 9 could be pre-cut in the same manner with the diamond-shaped saw and selectively etched to achieve the shape shown in FIG. 9.

As illustrated in FIG. 31, the next step in fabricating a contact is to form lower insulation layer 321 on the bottom surface of substrate wafer 300 according to a pattern. Lower insulation layer 321 is discussed above in reference to FIG. 11.

Figure 32:
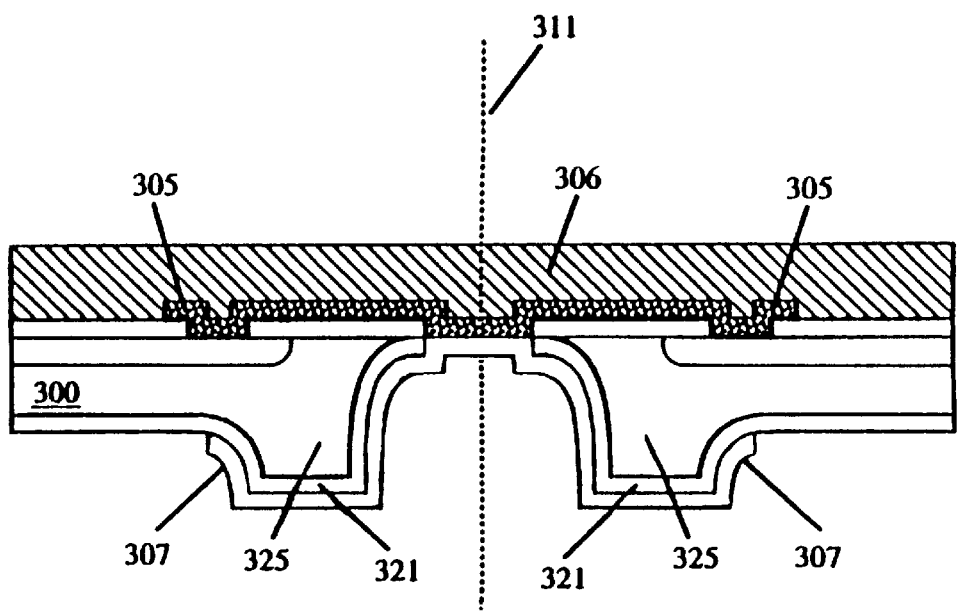
FIG. 32 shows a cross-sectional side view of the wafer portion of the previous Figure after contact wires have been formed on the bottom of the wafer according to a pattern.

As illustrated in FIG. 32, the next step in fabricating a contact is to form lower wire or contact layer 307 on the bottom surface of substrate wafer 300 according to a pattern. Contact layer 307 is discussed above in connection with FIG. 12.

The final step in fabricating a contact according to this embodiment, is to separate substrate wafer 300 into completed electronic devices, each with a set of attached contacts, as Illustrated in FIG. 33. The separation formed by this sawing, etching or the like finishes the formation of the contact. FIG. 33 also shows a bottom view of the same two die of the previous Figure, the previous Figure being a cross section view taken along line 33(a). Each die has multiple rows of contacts along each edge.

In some embodiments, the electronic device is now completely packaged, unlike those prior-art techniques in which wafers are separated into dies, which are subsequently assembled into packaged devices. Alternatively, additional test or marking steps might be required.

Alternatively, additional device assembly steps might be required in embodiments where contacts on the bottom of the device as disclosed herein are combined with additional contacts on the top of the device that are fabricated using other techniques. For some uses of some types of electronic devices, it may be an advantage that contacts as disclosed herein can be combined in the same electronic device with top-side connections.

Referring now to FIG. 34, a complete bottom view of an electronic device similar to that of the previous Figure is shown, except that the device includes ribbed-shaped drop bottoms 315. Drop bottoms 315 are protruding portions of substrate 300. They are formed by selectively not thinning portions of the bottom of substrate portion 300 during at least part of the thinning step discussed in connection with FIG. 31. Drop bottoms 315 are discussed above in connection with FIG. 15, FIG. 16 and FIG. 24.

Figure 35:
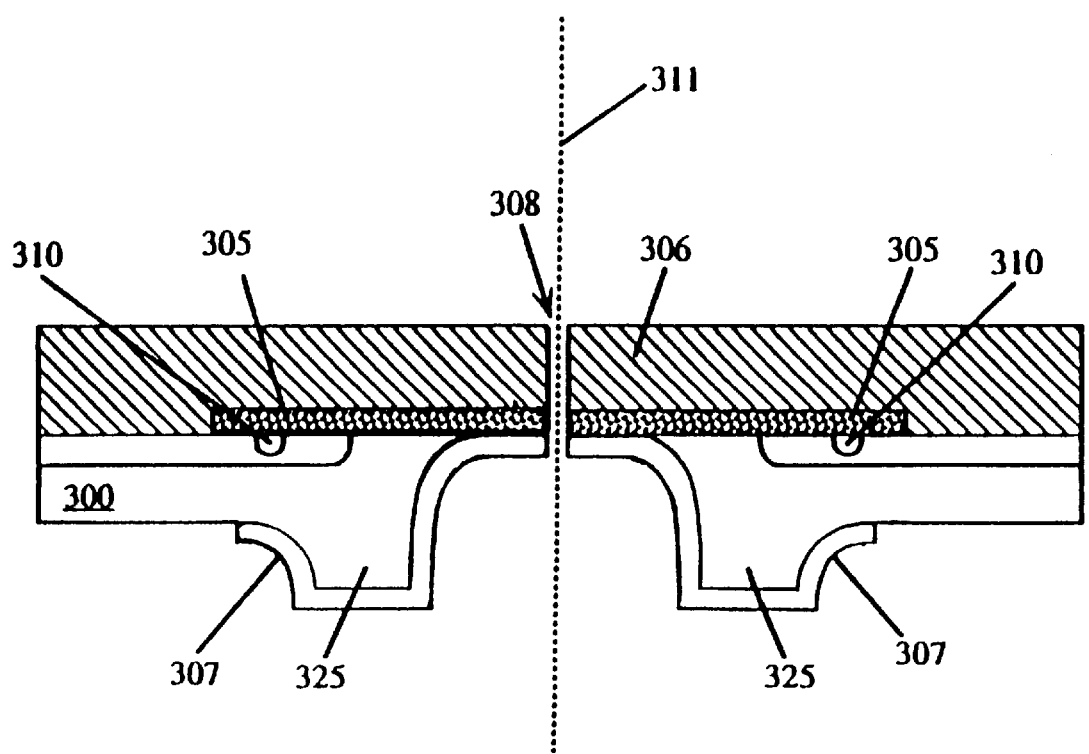
FIG. 35 shows a cross-sectional side view of two electronic devices and contacts comparable to those of FIGS. 33(a) and 33(b), but made using a gallium arsenide substrate wafer for which no insulator is necessary.

Die-Bottom Contacts with a Substrate Standoff Fabricated using a Single Bottom-Surface Trench and an Insulative Substrate A contact comprising an insulative substrate standoff and a wire that runs onto it is shown in FIG. 35.

A brief description of how such a contact can be fabricated is as follows:

1) An upper or interconnection wire or beam is formed on the top surface of a substrate, such as but not limited to a semiconductor wafer. The circuit or component that will make up the finished electronic device (such as but not limited to an integrated circuit) is formed using the substrate, or is attached to the substrate. The upper interconnection wire runs from a connection point within the circuit to the separation plane between devices.

2) The top of the substrate is encapsulated. Optionally, the encapsulant includes a cap layer.

3) The substrate is thinned from the bottom, thus forming the bottom surface of the substrate standoff. The substrate is further selectively thinned from the bottom, thus forming the sidewalls of the substrate standoff. This selective thinning forms a relatively large trench in the bottom surface of the substrate, thus exposing part of the bottom surface of the upper wire. This selective thinning may be performed by first making a saw cut along the device separation plane and then etching.

4) A lower wire or contact layer is formed that runs on the bottom surface of the lower insulation layer from the exposed portion of the upper wire and onto the standoff.

5) Optionally, the top surface of the electronic devices are marked, so as to identify the part type and the orientation of pin number 1.

6) The wafer is diced. For some embodiments, this completes the fabrication of the electronic device.

7) Optionally, the electronic devices are tested while still attached to a carrier.

FIG. 35 shows a contact according to embodiments that use an insulative substrate and die-bottom contacts on a substrate standoff. The major difference from the silicon-based, substrate-standoff contact of FIG. 33 is that insulation layers 304 and 321 are missing. If the insulative substrate is gallium arsenide, connection point 310 is formed by doping the gallium arsenide so that it becomes conductive where it will electrically connect to interconnect wire 305.

The process required to produce a contact according to this insulative substrate embodiment is even simpler than that disclosed for conductive substrates, which may result in advantages such as reduced cost and higher yield. Also, the resulting contact has even fewer elements than for conductive substrates, which may help improve the reliability of the contact.

The relative simplicity of the contact of this embodiment may help to minimize parasitic elements being introduced into the circuit in which the contact is used. For some uses of some types of devices, including but not limited to power-switching devices and the like, this may be a significant advantage.

Figure 36A:
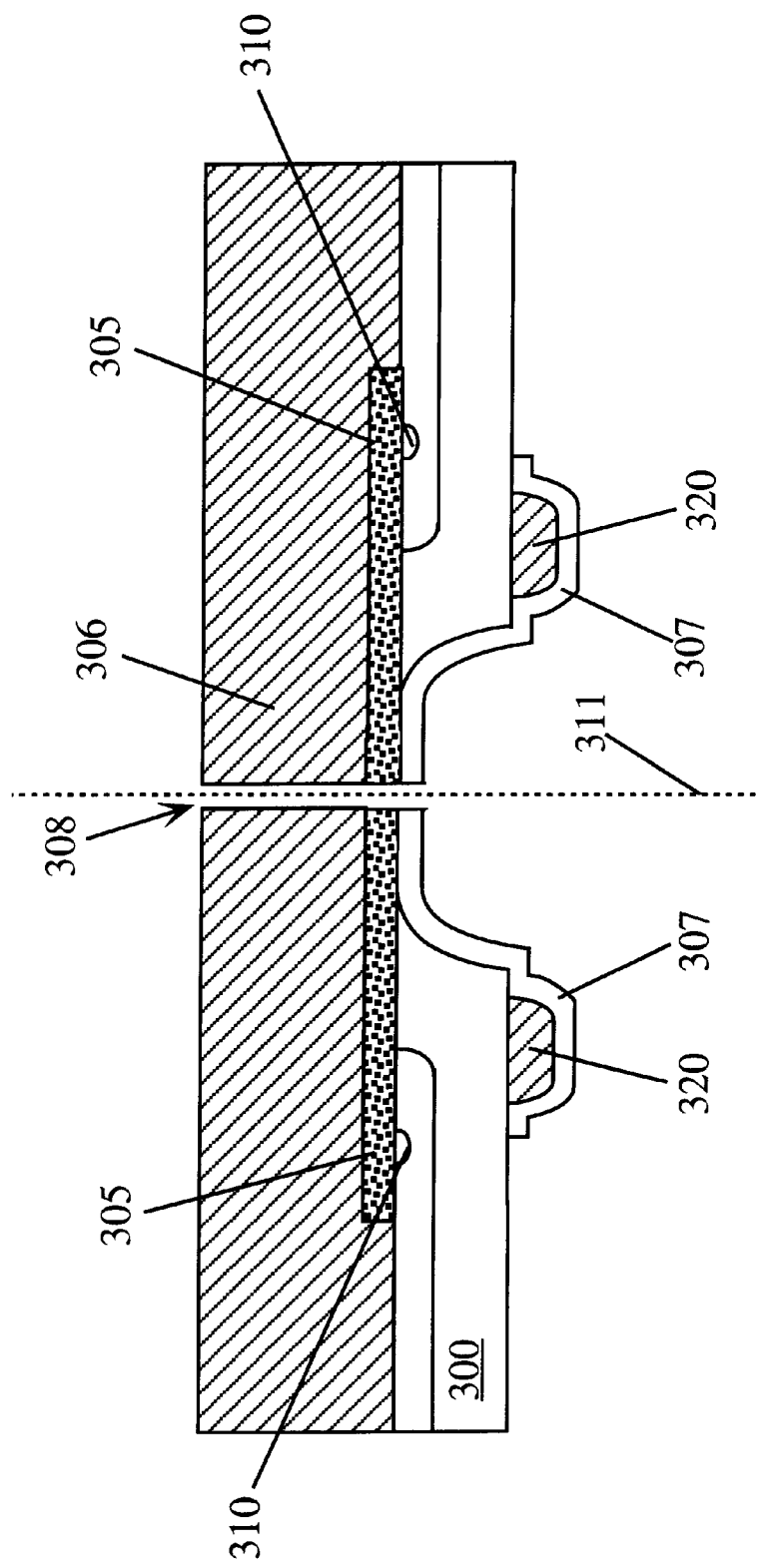
FIGS. 36(a) and 36(b) show a cross-sectional side view of two electronic devices and contacts comparable to those of the previous Figure and of FIGS. 33(a) and 33(b), but made with epoxy standoffs on a gallium arsenide substrate.
Figure 36B:
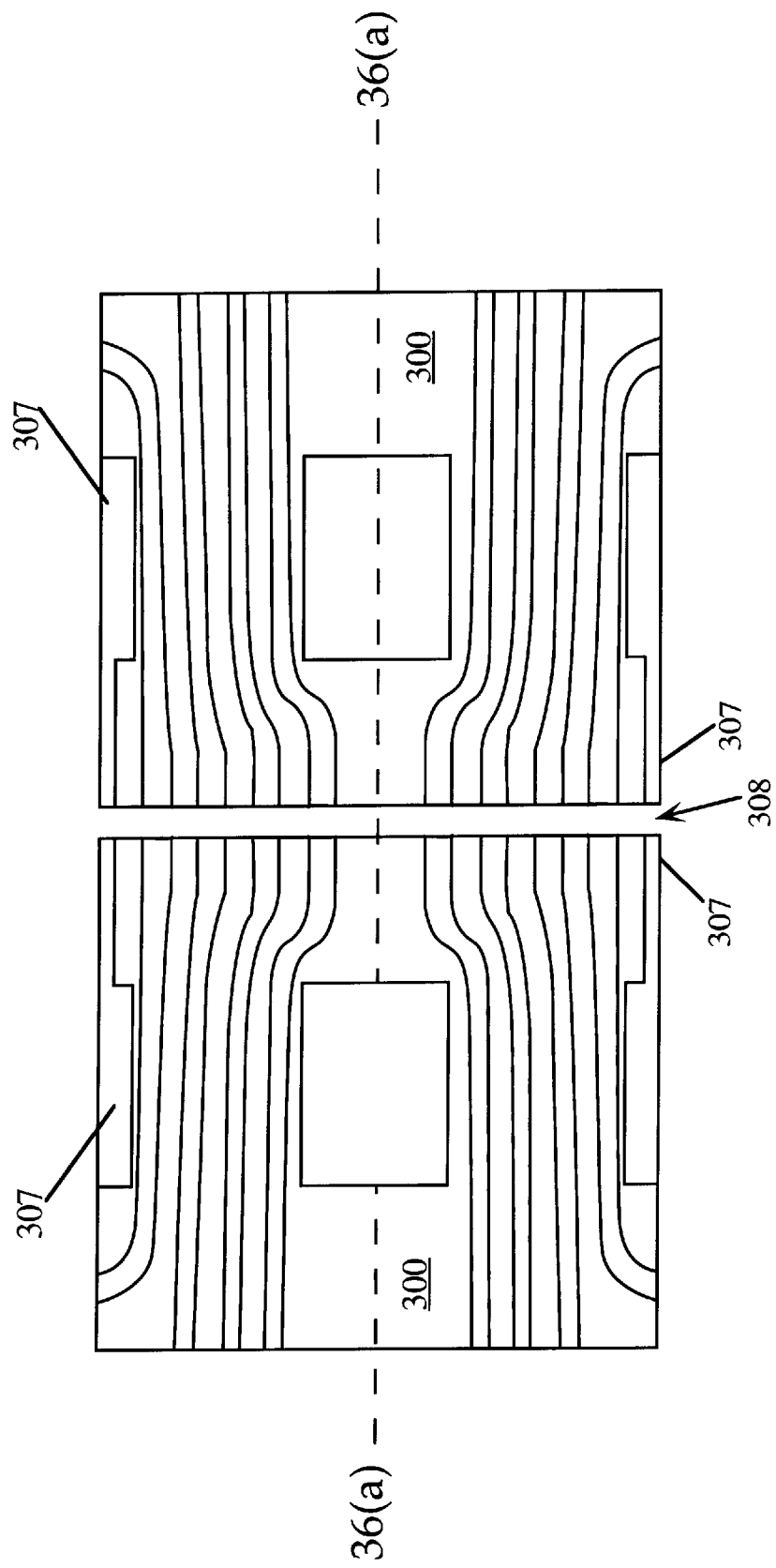

Die-Bottom Contacts with a Formed Standoff Fabricated using a Single Bottom-SurfaceTrench and an insulative Substrate A contact comprising a formed standoff and a wire that runs onto it is shown in FIG. 36.

A brief description of how such a contact can be fabricated is as follows:

1) An upper or interconnection wire or beam is formed on the top surface of a substrate, such as but not limited to a semiconductor wafer. The circuit or component that will make up the finished electronic device (such as but not limited to an integrated circuit) is formed using the substrate, or is attached to the substrate. The upper interconnection wire runs from a connection point within the circuit to the separation plane between devices.

2) The top of the substrate is encapsulated. Optionally, the encapsulant includes a cap layer.

3) The substrate is thinned from the bottom, thus forming the bottom surface of the finished device. The substrate is further selectively thinned from the bottom, thus forming a relatively large trench in the bottom surface of the substrate, thus exposing part of the bottom surface of the upper wire. This selective thinning may be performed by first making a saw cut along the device separation plane and then etching.

4) A standoff is formed on the bottom surface of the wafer.

5) A lower wire or contact layer is formed that runs on the bottom surface of the lower insulation layer from the exposed portion of the upper wire and onto the standoff.

6) Optionally, the top surface of the electronic devices are marked, so as to identify the part type and the orientation of pin number 1.

7) The wafer is diced. For some embodiments, this completes the fabrication of the electronic device.

8) Optionally, the electronic devices are tested while still attached to the carrier.

FIG. 36 shows a contact according to embodiments that use an insulative substrate and die-bottom contacts on a formed standoff. The major difference from the insulative-substrate, substrate-standoff contact of FIG. 35 is that substrate standoff 325 is replaced with formed standoff 320. Formed standoff 320 is discussed above in reference to FIG. 10.

Figure 37:
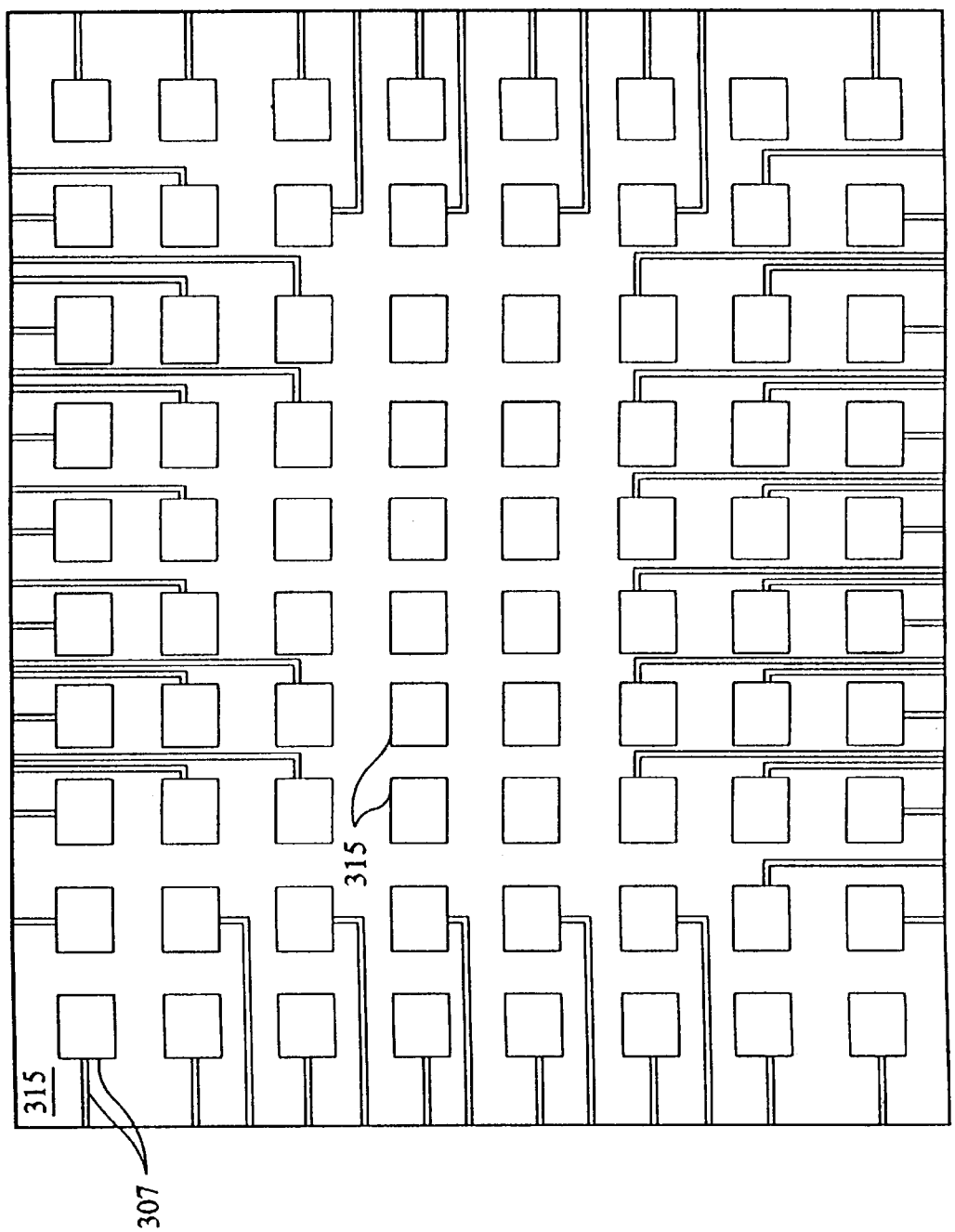
FIG. 37 shows a complete bottom view of one of the electronic devices of the previous Figure, with multiple contacts in a two dimensional array and with a bottom substrate surface that drops down, in a pillared pattern, to circuit-board level to transfer heat generated in the electronic device to the circuit board.

FIG. 37 shows a complete bottom view of one of the electronic devices of the previous Figure, with multiple contacts in a two dimensional array and with a bottom substrate surface that drops down, in a pillared pattern, to circuit-board level.

Die-Bottom Contacts With Drop Bottoms

FIG. 15, FIG. 16, FIG. 24, FIG. 34; and FIG. 37 show contact embodiments that include at least one drop bottom 315. Drop bottom 315 is a protruding portion of substrate 300. Drop bottom 315 has a bottom surface approximately co-planar with the bottom of the contacts of the finished electronic device.

Drop bottom 315 is formed by selectively not thinning portions of the bottom of substrate portion 300a during at least part of the thinning step that exposes the wire on the bottom of the encapsulant protrusion. Forming drop bottom 315 sometimes requires a first thinning step that forms the bottom surface of drop bottom 315, followed by a second selective thinning step that exposed the wire without further thinning drop bottom 315.

Drop bottom 315 mechanically connects with the circuit board, glass plate, or the like to which the electronic device is attached, so that heat can be transferred out of the electronic device and into the larger system, where the heat might be more easily dissipated without overheating the device. Optionally, drop bottom 315 can electrically connect to the circuit board and can be used to supply the substrate voltage or signal for the device.

Although it is only illustrated herein in connection with a selected subset of contact types or embodiments, drop bottom 315 can be employed with every type or embodiment of contact described herein.

Drop bottom 315 is been described herein as having a variety of shapes:

1) a square or rectangle large enough to cover most of the bottom surface of the electronic device, as shown in FIG. 15;

2) an irregular shape, perhaps covering the portions of the electronic device that generate significant heat; as shown in FIG. 24;

3) ribs, as shown in FIG. 34; and 4) pillars, as shown in FIG. 37.

Drop bottom 315 could take on any shape including but limited to the above, horizontal ribs, vertical ribs, angled ribs, a single rib or wide strip down the middle of the device, combinations thereof and patterns thereof.

The shape of drop bottom 315 and the number of drop bottoms 315 in a device are design alternatives that can be chosen taking into account the size of the electronic device, the heat generation characteristics of the electronic device, the heat absorption characteristics of the circuit board or other apparatus to which the electronic device is attached and the characteristics of the method of attaching the electronic device to the circuit board. For example, for a small device, a square or rectangle large enough to cover most of its bottom surface might be the simplest and most reliable, whereas for a large device such a drop bottom might introduce thermal expansion problems or solder flow problems that could be avoided by a ribbed or pillared drop bottom.

Any shapes or number of drop bottoms 315 could be used in conjunction with any contact embodiment described herein.

Described herein are several methods for fabricating several different types of contacts for electrical and electronic devices. The embodiments described can be employed in ways that potentially realize one or more significant advantages, including but not limited to short and simple fabrication processes, simple and reliable contacts, high wafer packing density, and contacts with advantageous physical and electronic properties that are applicable for use with varied types of electronic devices.

The processes of fabricating contacts disclosed herein can potentially be advantageously short and simple. Shorter and simpler fabrication processes may decrease device manufacturing cost and increase manufacturing yields, i.e. the percentage of devices fabricated that actually function as specified. In some embodiments, an electronic device can be completely packaged using wafer fabrication processes, unlike those prior-art techniques in which wafers are separated into dies, which are subsequently assembled into packaged devices. Further, the finished electronic devices might be tested while still in wafer form. Alternatively, the finished devices might be tested after being separated, and the typical prior-art wafer testing step might be eliminated. Further, the processes disclosed for a contact with an insulative substrate, such as gallium arsenide, is even simpler than the processes disclosed for conductive substrates, such as silicon, which might further enhance these advantages.

The contacts disclosed herein can potentially be advantageously simple, mechanically rugged and sturdy, and contain relatively few elements. Thus, they might be inherently reliable. Further, the contacts disclosed using an insulative substrate, such as gallium arsenide, have even fewer elements compared to those described for conductive substrates, such as silicon, and thus might be even more inherently reliable.

Wafer packing density can potentially be advantageously increased over those prior-art techniques that use substrate area to fabricate contacts. No substrate wafer area is dedicated to forming contacts; thus more replications of the electronic circuit or discrete component may fit on a wafer; thus manufacturing costs per device may be lower.

The contacts disclosed herein can potentially have advantageous physical properties, which may make them advantageously adaptable for use with electronic devices of different types. An inter-contact pitch compatible with 300-micron surface mount techniques is easily achieved. In various embodiments, the contact layer can be formed of an easily solderable material, or formed of gold, or formed of whatever material is suited for the particular mounting technique to be employed with the completed electronic device. Contacts formed on the bottom surface of the substrate as described herein might be combined in the same electronic device with contacts or pads on the top surface of the substrate; thus increasing the number of contacts per device and allowing flexibility in the types of contacts a device uses.

The contacts disclosed herein can potentially have advantageous electronic properties, which may make them advantageously adaptable for use with electronic devices of different types. The contact's bottom surface dimensions, both length and width, can vary from contact to contact, which may reduce or eliminate the need to dedicate multiple contacts to carrying the a signal or a power supply voltage that requires substantial current. Both because of their varying sizes and because of their relative simplicity, the resulting contacts may help to minimize parasitic circuit effects, which may be advantageous for uses such as power switching devices and the like.

In the foregoing specification, the invention has been described with reference to specific exemplary embodiments thereof. It will, however, be evident that various modifications and changes may be made to those described herein without departing from the broader spirit and scope of the invention as set forth in the following claims. The specification and drawings are, accordingly, to be regarded in an illustrative rather than a restrictive sense.

What is claimed is:

1. A method of fabricating a contact for an electronic device, comprising:
    forming a trench in the top surface of a substrate, the substrate having an electronic circuit that includes a connection point;
    forming an upper wire above the substrate, the upper wire running from the connection point into the trench;
    forming an encapsulant layer above the upper wire and the substrate, the encapsulant layer forming a protrusion in the trench;
    thinning the bottom surface of the substrate under at least a portion of the encapsulant protrusion so as to expose at least a portion of the bottom surface of the upper wire;
    forming a standoff below the bottom surface of the substrate; and
    forming a lower wire that runs from the exposed portion of the upper wire onto the standoff.

2. The method of claim 1, further comprising:
    forming an upper insulation layer located between the substrate and the upper wire, the upper insulation layer having a contact through-hole at the connection point and not covering at least a portion of the trench; and
    forming a lower insulation layer located between the substrate and the lower wire, the lower insulation layer not covering at least a portion of the bottom surface of the upper wire on the encapsulant protrusion.

3. The method of claim 1, wherein the trench forming includes cutting a starter trench and thereafter etching the starter trench to form the trench.

4. The method of claim 1, wherein the thinning is patterned so as to leave a portion of the bottom surface of the substrate substantially co-planar with the lower wire.

5. The method of claim 1, wherein the substrate is formed of material selected from the group consisting essentially of silicon, gallium arsenide, silicon germanium, silicon carbide, gallium phosphide, ceramic materials, sapphire and quartz.

6. The method of claim 1, wherein the electronic circuit is selected from the group consisting of an integrated circuit fabricated using the substrate, an electronic circuit fabricated using the substrate, an active discrete electronic component fabricated using the substrate, a passive discrete electronic component fabricated using the substrate, an integrated circuit attached to the substrate, an electronic circuit attached to the substrate, an active discrete electronic component attached to the substrate, and a passive discrete electronic component attached to the substrate.

7. The method of claim 1, wherein the upper wire is formed of material selected from the group consisting essentially of gold, silver, copper, aluminum, nickel, and layers thereof.

8. The method of claim 1, wherein the encapsulant is formed of material selected from the group consisting essentially of epoxy, plastic, glass, polymide resin, Teflon, silicon oxide, silicon nitride, silicon, polysilicon, amorphous silicon, aluminum, diamond, and layers thereof.

9. The method of claim 1, wherein the lower wire is formed of material selected from the group consisting essentially of gold, silver, nickel, nichrome-gold, nichrome-nickel, nickel-arsenic-gold, nickel-arsenic, nickel-gold, gold-tin-oxide, palladium-silicide, titanium, tungsten, titanium-tungsten, indium titanium oxide, aluminum, copper, platinum, alloys thereof, and layers thereof.

10. The method of claim 2, wherein the upper insulation layer is formed of material selected from the group consisting essentially of silicon oxide, silicon nitride, aluminum oxide, polymide resins, epoxy, acrylics, patternable plastics, mixtures thereof, and layers thereof.

11. The method of claim 2, wherein the lower insulation layer is formed of material selected from the group consisting essentially of silicon oxide, silicon nitride, aluminum oxide, polymide resins, epoxy, acrylics, patternable plastics, mixtures thereof, and layers thereof.

12. A method of fabricating a contact for an electronic device, comprising:
    forming a trench in the top surface of a substrate, the substrate having an electronic circuit that includes a connection point;
    forming an upper wire above the substrate, the upper wire running from the connection point into the trench;
    forming an encapsulant layer above the upper wire and the substrate, the encapsulant layer forming a protrusion in the trench;
    thinning the bottom surface of the substrate under at least a portion of the encapsulant protrusion so as to expose at least a portion of the bottom surface of the upper wire, the thinning being patterned so as to form a substrate standoff; and
    forming a lower wire that runs from the exposed portion of the upper wire onto the substrate standoff.

13. The method of claim 12, further comprising:
   forming an upper insulation layer located between the substrate and the upper wire, the upper insulation layer having a contact through-hole at the connection point and not covering at least a portion of the trench; and
   forming a lower insulation layer located between the substrate and the lower wire, the lower insulation layer not covering at least a portion of the bottom surface of the upper wire on the encapsulant protrusion.

14. The method of claim 12, wherein the trench forming includes cutting a starter trench and thereafter etching the starter trench to form the trench.

15. The method of claim 12, wherein the thinning is patterned so as to leave a portion of the bottom surface of the substrate substantially co-planar with the lower wire.

16. The method of claim 12, wherein the substrate is formed of material selected from the group consisting essentially of silicon, gallium arsenide, silicon germanium, silicon carbide, gallium phosphide, ceramic materials, sapphire and quartz.

17. The method of claim 12, wherein the electronic circuit is selected from the group consisting of an integrated circuit fabricated using the substrate, an electronic circuit fabricated using the substrate, an active discrete electronic component fabricated using the substrate, a passive discrete electronic component fabricated using the substrate, an integrated circuit attached to the substrate, an electronic circuit attached to the substrate, an active discrete electronic component attached to the substrate, and a passive discrete electronic component attached to the substrate.

18. The method of claim 12, wherein the upper wire is formed of material selected from the group consisting essentially of gold, silver, copper, aluminum, nickel, and layers thereof.

19. The method of claim 12, wherein the encapsulant is formed of material selected from the group consisting essentially of epoxy, plastic, glass, polymide resin, Teflon, silicon oxide, silicon nitride, silicon, polysilicon, amorphous silicon, aluminum, diamond, and layers thereof.

20. The method of claim 12, wherein the lower wire is formed of material selected from the group consisting essentially of gold, silver, nickel, nichrome-gold, nichrome-nickel, nickel-arsenic-gold, nickel-arsenic, nickel-gold, gold-tin-oxide, palladium-silicide, titanium, tungsten, titanium-tungsten, indium titanium oxide, aluminum, copper, platinum, alloys thereof, and layers thereof.

21. The method of claim 13, wherein the upper insulation layer is formed of material selected from the group consisting essentially of silicon oxide, silicon nitride, aluminum oxide, polymide resins, epoxy, acrylics, patternable plastics, mixtures thereof, and layers thereof.

22. The method of claim 13, wherein the lower insulation layer is formed of material selected from the group consisting essentially of silicon oxide, silicon nitride, aluminum oxide, polymide resins, epoxy, acrylics, patternable plastics, mixtures thereof, and layers thereof.

23. A method of fabricating a contact for an electronic device, comprising:
   forming an upper wire above the top surface of a substrate, the substrate having an electronic circuit that includes a connection point, the upper wire having an inner portion connected to the connection point and an outer portion extending beyond the edge of the electronic circuit;
   forming an encapsulant layer above the upper wire and the substrate;
   thinning the bottom surface of the substrate under the outer portion of the upper wire so as to expose a portion of its bottom surface, the thinning being patterned so as to form a substrate standoff; and
   forming a lower wire that runs from the exposed portion of the upper wire onto the substrate standoff.

24. The method of claim 23, further comprising:
   forming an upper insulation layer located between the substrate and the upper wire, the upper insulation layer having a contact through-hole at the connection point and not covering at least a portion of the trench; and
   forming a lower insulation layer located between the substrate and the lower wire, the lower insulation layer not covering at least a portion of the bottom surface of the upper wire on the encapsulant protrusion.

25. The method of claim 23, wherein the trench forming includes cutting a starter trench and thereafter etching the starter trench to form the trench.

26. The method of claim 23, wherein the thinning is patterned so as to leave a portion of the bottom surface of the substrate substantially co-planar with the lower wire.

27. The method of claim 23, wherein the substrate is formed of material selected from the group consisting essentially of silicon, gallium arsenide, silicon germanium, silicon carbide, gallium phosphide, ceramic materials, sapphire and quartz.

28. The method of claim 24, wherein the electronic circuit is selected from the group consisting of an integrated circuit fabricated using the substrate, an electronic circuit fabricated using the substrate, an active discrete electronic component fabricated using the substrate, a passive discrete electronic component fabricated using the substrate, an integrated circuit attached to the substrate, an electronic circuit attached to the substrate, an active discrete electronic component attached to the substrate, and a passive discrete electronic component attached to the substrate.

29. The method of claim 24, wherein the upper wire is formed of material selected from the group consisting essentially of gold, silver, copper, aluminum, nickel, and layers thereof.

30. The method of claim 24, wherein the encapsulant is formed of material selected from the group consisting essentially of epoxy, plastic, glass, polymide resin, Teflon, silicon oxide, silicon nitride, silicon, polysilicon, amorphous silicon, aluminum, diamond, and layers thereof.

31. The method of claim 24, wherein the lower wire is formed of material selected from the group consisting essentially of gold, silver, nickel, nichrome-gold, nichrome-nickel, nickel-arsenic-gold, nickel-arsenic, nickel-gold, gold-tin-oxide, palladium-silicide, titanium, tungsten, titanium-tungsten, indium titanium oxide, aluminum, copper, platinum, alloys thereof, and layers thereof.

32. The method of claim 25, wherein the upper insulation layer is formed of material selected from the group consisting essentially of silicon oxide, silicon nitride, aluminum oxide, polymide resins, epoxy, acrylics, patternable plastics, mixtures thereof, and layers thereof.

33. The method of claim 25, wherein the lower insulation layer is formed of material selected from the group consisting essentially of silicon oxide, silicon nitride, aluminum oxide, polymide resins, epoxy, acrylics, patternable plastics, mixtures thereof, and layers thereof.

34. A method of fabricating a contact for an electronic device, comprising:
   forming an upper wire above the top surface of a substrate, the substrate having an electronic circuit that includes a connection point, the upper wire having an inner portion connected to the connection point and an outer portion extending beyond the edge of the electronic circuit;

forming an encapsulant layer above the upper wire and the substrate;

thinning the bottom surface of the substrate under the outer portion of the upper wire so as to expose a portion of its bottom surface;

forming a standoff below the bottom surface of the substrate; and forming a lower wire that runs from the exposed portion of the upper wire onto the standoff.

35. The method of claim 34, further comprising:

forming an upper insulation layer located between the substrate and the upper wire, the upper insulation layer having a contact through-hole at the connection point and not covering at least part of the outer portion of the upper wire; and forming a lower insulation layer located between the substrate and the lower wire, the lower insulation layer not covering at least part of the outer portion of the upper wire.

36. The method of claim 34, wherein the trench substrate thinning includes forming a starter cut and thereafter etching the starter cut.

37. The method of claim 34, wherein the thinning is patterned so as to leave a portion of the bottom surface of the substrate substantially co-planar with the lower wire.

38. The method of claim 34, wherein the substrate is formed of material selected from the group consisting essentially of silicon, gallium arsenide, silicon germanium, silicon carbide, gallium phosphide, ceramic materials, sapphire and quartz.

39. The method of claim 34, wherein the electronic circuit is selected from the group consisting of an integrated circuit fabricated using the substrate, an electronic circuit fabricated using the substrate, an active discrete electronic component fabricated using the substrate, a passive discrete electronic component fabricated using the substrate, an integrated circuit attached to the substrate, an electronic circuit attached to the substrate, an active discrete electronic component attached to the substrate, and a passive discrete electronic component attached to the substrate.

40. The method of claim 34, wherein the upper wire is formed of material selected from the group consisting essentially of gold, silver, copper, aluminum, nickel, and layers thereof.

41. The method of claim 34, wherein the encapsulant is formed of material selected from the group consisting essentially of epoxy, plastic, glass, polymide resin, Teflon, silicon oxide, silicon nitride, silicon, polysilicon, amorphous silicon, aluminum, diamond, and layers thereof.

42. The method of claim 34, wherein the lower wire is formed of material selected from the group consisting essentially of gold, silver, nickel, nichrome-gold, nichrome-nickel, nickel-arsenic-gold, nickel-arsenic, nickel-gold, gold-tin-oxide, palladium-silicide, titanium, tungsten, titanium-tungsten, indium titanium oxide, aluminum, copper, platinum, alloys thereof, and layers thereof.

43. The method of claim 35, wherein the upper insulation layer is formed of material selected from the group consisting essentially of silicon oxide, silicon nitride, aluminum oxide, polymide resins, epoxy, acrylics, patternable plastics, mixtures thereof, and layers thereof.

44. The method of claim 35, wherein the lower insulation layer is formed of material selected from the group consisting essentially of silicon oxide, silicon nitride, aluminum oxide, polymide resins, epoxy, acrylics, patternable plastics, mixtures thereof, and layers thereof.

* * * * *